(12) United States Patent
Katoh

(10) Patent No.: US 7,723,827 B2
(45) Date of Patent: May 25, 2010

(54) SEMICONDUCTOR STORAGE DEVICE AND PRODUCTION METHOD THEREFOR

(75) Inventor: Yuukoh Katoh, Tokyo (JP)

(73) Assignee: NEC Corporation, Tokyo (JP)

( * ) Notice: Subject to any disclaimer, the term of this patent is extended or adjusted under 35 U.S.C. 154(b) by 1250 days.

(21) Appl. No.: 10/514,126

(22) PCT Filed: May 13, 2003

(86) PCT No.: PCT/JP03/05953

§ 371 (c)(1),
(2), (4) Date: Nov. 12, 2004

(87) PCT Pub. No.: WO03/096423

PCT Pub. Date: Nov. 20, 2003

(65) Prior Publication Data

US 2005/0174876 A1 Aug. 11, 2005

(30) Foreign Application Priority Data

May 13, 2002 (JP) .............................. 2002-136484

(51) Int. Cl.
*H01L 23/552* (2006.01)
*H01L 21/00* (2006.01)

(52) U.S. Cl. ............... 257/659; 257/660; 257/E21.665; 438/3

(58) Field of Classification Search .............. 438/3; 365/158, 171; 430/270.1; 257/659, 660, 257/E21.665
See application file for complete search history.

(56) References Cited

U.S. PATENT DOCUMENTS

| | | | |
|---|---|---|---|
| 6,165,803 A * | 12/2000 | Chen et al. ............. | 438/3 |
| 6,452,764 B1 | 9/2002 | Abraham et al. | |
| 6,510,080 B1 * | 1/2003 | Farrar ................. | 365/171 |
| 6,590,750 B2 | 7/2003 | Abraham et al. | |
| 6,737,283 B2 * | 5/2004 | Morgan ................ | 438/3 |
| 6,765,821 B2 * | 7/2004 | Saito et al. ............ | 365/158 |
| 6,841,224 B2 | 1/2005 | Kamata et al. | |
| 6,870,714 B2 * | 3/2005 | Drewes ............... | 428/811.1 |

(Continued)

FOREIGN PATENT DOCUMENTS

JP 04-344383 11/1992

(Continued)

OTHER PUBLICATIONS

R. Scheuerlein et al., "A 10ns Read and Write Non-Volatile Memory Array Using a Magnetic Tunnel Junction and FET Switch in Each Cell," IEEE International Solid State Circuits Conference, 2000, pp. 1-4.

*Primary Examiner*—Davienne Monbleau
*Assistant Examiner*—Monica D Harrison
(74) *Attorney, Agent, or Firm*—Foley & Lardner LLP

(57) ABSTRACT

Portions excluding magnetic elements of a laminate film of magnetic films or the like constituting magnetic elements (1) are oxidized/nitrided or oxynitrided to be insulated by a plasma processing using a conductive mask (17), whereby a plurality of magnetic elements are separated. This laminate film comprises a magnetic element region (18) formed with magnetic elements (1) and an insulated region (19) consisting of oxides/nitrides or oxynitrides. Upper wiring such as a bit line (3) is formed later. Since the conductive mask used in forming the insulated region is made part of the upper wiring, the magnetic elements and the upper wiring can be disposed in contact with each other.

41 Claims, 24 Drawing Sheets

50: WORD LINE
50a: LEADER LINE
51: BIT LINE
52: TMR
53: WIRING
55: PLUG
60: VIA-HOLE

U.S. PATENT DOCUMENTS

| | | | |
|---|---|---|---|
| 6,949,324 B2 * | 9/2005 | Watanabe et al. | 430/270.1 |
| 2001/0010938 A1 * | 8/2001 | Bronner et al. | 438/3 |
| 2001/0040778 A1 | 11/2001 | Abraham et al. | |

FOREIGN PATENT DOCUMENTS

| | | |
|---|---|---|
| JP | 09-321153 | 12/1997 |
| JP | 11-288585 | 10/1999 |
| JP | 2000-353791 | 12/2000 |
| JP | 2001-217398 | 8/2001 |
| JP | 2002-009366 | 1/2002 |
| JP | 2002-359138 A | 12/2002 |

* cited by examiner

1: MAGNETIC ELEMENT
2: WIRING A
2a: LEADER LINE
3: WIRING B
4: VIA-HOLE 5,7,22: INSULATION FILM
6,21: ETCHING STOP FILM
17: MASK
18: MAGNETIC ELEMENT REGION
19: INSULATED REGION 8,10,16: CONDUCTOR FILM
9: CONDUCTOR OXIDATION PREVENTIVE FILM
11,15: TUNNEL FILM
12: MAGNETIC ELEMENT LOWER-LAYER FILM
13: MAGNETIC ELEMENT FORMING FILM
14: MAGNETIC ELEMENT UPPER-LAYER FILM
17: MASK

50: WORD LINE
50a: LEADER LINE
51: BIT LINE
52: TMR
53: WIRING
55: PLUG
60: VIA-HOLE 54,57,62: SILICON OXIDE FILM
56,61: SILICON NITRIDE FILM
59: MAGNETIC MATERIAL OXIDE FILM
64: MASK

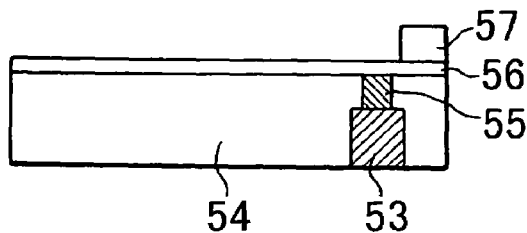
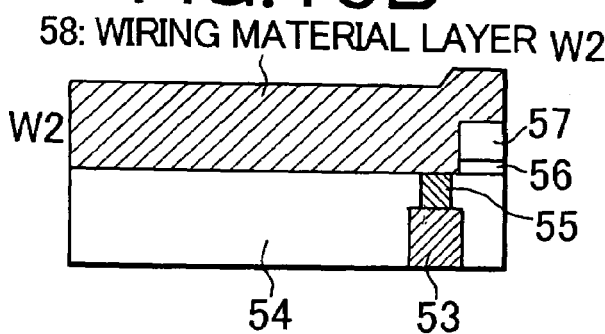
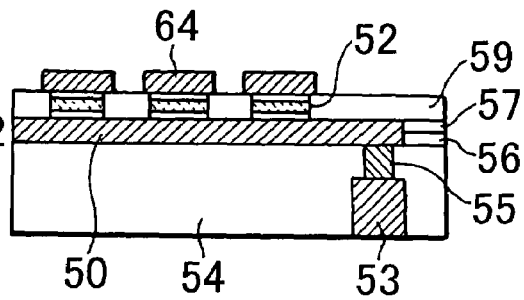
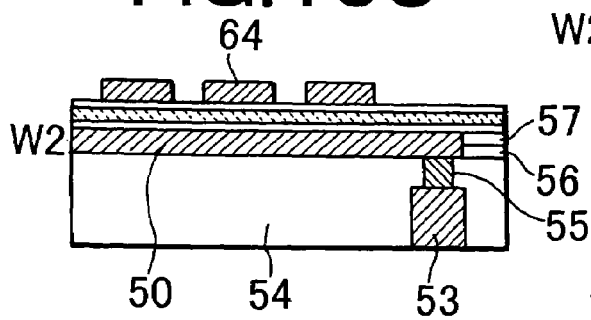
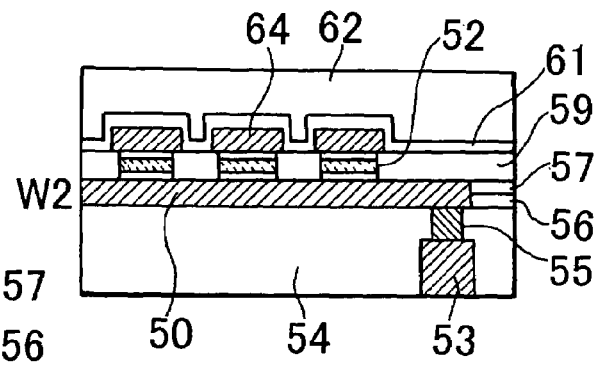
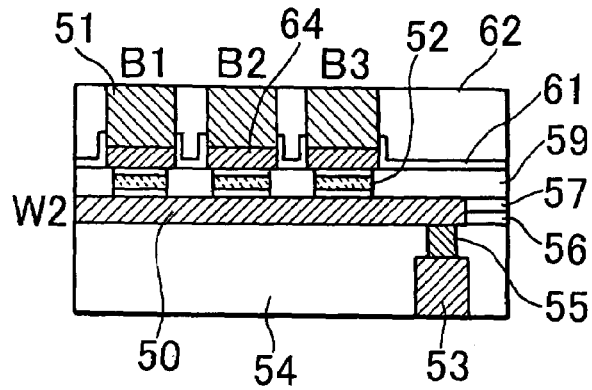

70: WRITING WORD LINE
72, 72a: LEADER LINE

107: TMR
108: UPPER WIRING
109: THIRD WIRING
110: TRANSISTOR
111: LOWER WIRING
112: READ WORD LINE

FIG. 17

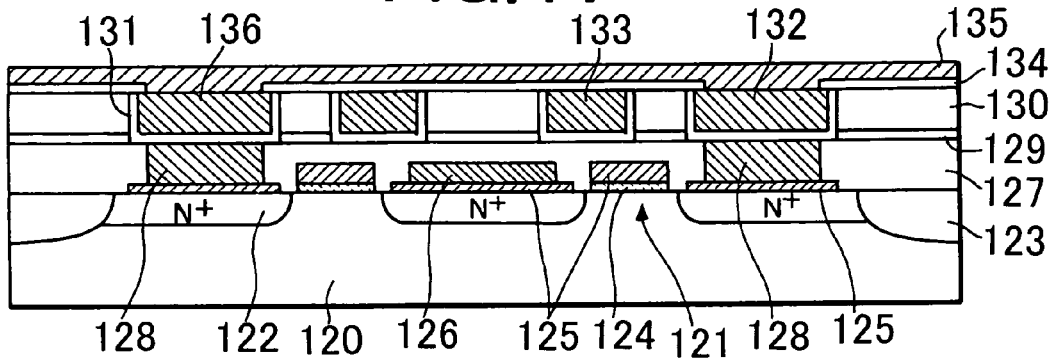

- 120: P-TYPE SILICON SUBSTRATE
- 121: NMOS SWITCHING TRANSISTOR
- 122: N⁺ REGION
- 123: INSULATING REGION
- 124: POLYSILICON LAYER
- 125: METAL LAYER
- 126: CONDUCTIVE LAYER
- 127: DIELECTRIC MATERIAL
- 128: PLUG CONDUCTOR
- 129: ETCHING STOP LAYER
- 130: SILICON DIOXIDE LAYER
- 131: HIGH-PERMEABILITY LAYER
- 132: CONDUCTIVE METAL LAYER
- 133: DIGIT WIRE
- 134: DIELECTRIC LAYER
- 135: CONDUCTIVE LAYER
- 136: WINDOW

FIG. 18

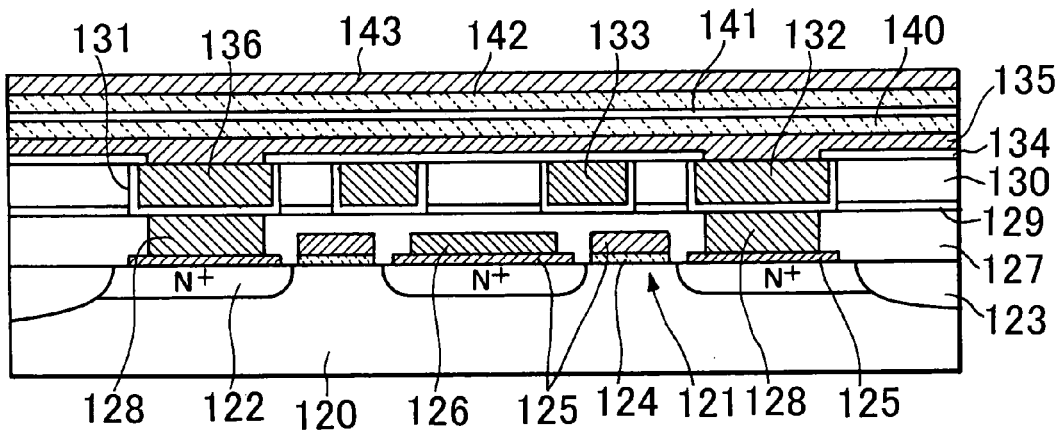

- 120: P-TYPE SILICON SUBSTRATE
- 121: NMOS SWITCHING TRANSISTOR
- 122: N+ REGION
- 123: INSULATING REGION
- 124: POLYSILICON LAYER
- 125: METAL LAYER
- 126: CONDUCTIVE LAYER
- 127: DIELECTRIC MATERIAL
- 128: PLUG CONDUCTOR
- 129: ETCHING STOP LAYER
- 130: SILICON DIOXIDE LAYER
- 131: HIGH-PERMEABILITY LAYER
- 132: CONDUCTIVE METAL LAYER
- 133: DIGIT WIRE
- 134: DIELECTRIC LAYER
- 135: CONDUCTIVE LAYER
- 136: WINDOW
- 140: BOTTOM MAGNETIC LAYER
- 141: NONMAGNETIC LAYER
- 142: UPPER MAGNETIC LAYER
- 143: MASKING LAYER

142a: ACTIVE REGION
142b: INACTIVE PORTION
144: MAGNETIC MEMORY ELEMENT
145: CONTACT METAL PAD

146: DIELECTRIC LAYER
147: ETCHING STOP LAYER
148: SILICON DIOXIDE LAYER
149: BIT LINE
150, 151: PERMALLOY LAYER

SEMICONDUCTOR STORAGE DEVICE AND PRODUCTION METHOD THEREFOR

TECHNICAL FIELD

The present invention relates to a semiconductor storage device (memory) in which an element (hereinafter referred to as a magnetic element) capable of changing a magnetized state, storing information by the magnetized state, and evaluating the magnetized state to thereby read stored information is used as a storage cell.

BACKGROUND ART

In this type of semiconductor storage device, for example, a magnetoresistive element has heretofore been used as a storage element. As an example of the magnetoresistive element, an element referred to as a tunneling magnetoresistance element (hereinafter referred to as TMR) will be described. In this element, a tunneling insulation film is held between two magnetic layers, and information is stored by resistance of the tunneling insulation film, which changes with a state of magnetization of the magnetic layers.

FIG. 15 shows an example of the TMR reported in 2000 IEEE International Solid-State Circuits Conference DIGEST OF TECHNICAL PAPERS (pp. 128 and 129). As shown in FIG. 15, an antiferromagnetic layer (thickness of 10 nm) 101 formed of FeMn, a pinned layer (thickness of 2.4 nm) 102 formed of CoFe, a tunneling insulating layer 103 formed of $Al_2O_3$, and a free layer (thickness of 5 nm) 104 formed of an NiFe are stacked, and the TMR is formed. The antiferromagnetic layer 101 and the free layer 104 are connected to conductor wirings (not shown), respectively, in order to apply a voltage to the TMR. The magnetization of the pinned layer 102 is fixed in a certain direction by the antiferromagnetic layer 101. The free layer 104 is formed in such a manner that the layer is easily magnetized in a certain direction, and the magnetization direction can be changed by application of a magnetic field from the outside. In a direction in a horizontal plane of a laminate film (direction along the film surface), an easily magnetized direction is referred to as an easy axis, and a direction vertical to this easy axis and difficult to magnetize is referred to as a difficult axis. When a voltage is applied between the free layer 104 and the pinned layer 102, a current flows through the tunneling insulating layer 103, but an ohmic value changes with a relation between the directions of the magnetizations of the free layer 104 and the pinned layer 102. That is, resistance is low in a case where the magnetization directions are the same, and the resistance increases in a case where the magnetization directions are opposite to each other.

Next, an example using the TMR as a storage element of a nonvolatile memory will be described with reference to FIG. 16. This example has been reported in the 2000 IEEE International Solid-State Circuits Conference DIGEST OF TECHNICAL PAPERS (pp. 130 and 131). In the example of FIG. 16, two systems of wirings nonparallel to each other (i.e. crossing each other) are disposed above/below TMRs 107 arranged in an array. An upper wiring (referred to as the wiring B (B1, B2, ...)) 108 is connected to the free layer of the TMR 107, and an antiferromagnetic layer of the TMR 107 is connected to a drain of a transistor 110 formed in a lower layer via a third wiring 109. An insulating layer (not shown) is disposed between the third wiring 109 and a lower layer which is a lower wiring (referred to as the wiring D (D1, D2, D3, ...) 111. To store data, when currents are passed through two wirings B, D, a synthetic magnetic field is generated in the vicinity of a region where these wirings cross each other, and the magnetization of the free layer of the corresponding TMR 107 is set in accordance with the direction of the current. Accordingly, the ohmic value of the TMR 107 can be changed. To read the data, the transistor 110 connected to the TMR 107 to read is brought into an on-state by a read word line (referred to as the wiring W (W1, W2, W3, ...) 112, the voltage is applied to the TMR 107 from the wiring B, and the ohmic value of the TMR is evaluated by the flowing current.

As methods in which the TMR is separated into elements to connect the upper wiring to an upper electrode for each TMR, there are lifting-off, heading by chemical mechanical polishing (CMP), a method using a via-hole and the like. In the lifting-off method, after forming a TMR material into a film, a lifting-off material is formed into a film, the TMR material film and lifting-off material film are processed into desired shapes, a TMR is formed and separated into elements, thereafter an insulation film is formed on the whole surface, thereafter the lifting-off material film is etched to remove the insulation film on the lifting-off material film, and an opening is formed above the TMR. Thereafter, an upper wiring material is formed into a film, and processed. In the heading by the CMP, instead of the lifting-off material, an upper electrode material is used, and similarly processed into a desired shape, the TMR and upper electrode are formed, and separated into elements, thereafter the insulation film is formed on the whole surface, and the surface is polished by the CMP to expose the upper electrode. Thereafter, the upper electrode material is formed into a film, and processed. In the method by the via hole, after a TMR having a desired shape is formed and separated into elements, an insulation film is formed on the whole surface, a resist mask which opens above the TMR is formed, and the insulation film is partially etched/removed to form an opening above the TMR. As another element separating method, there is a method in which an upper magnetic body is oxidized, and a TMR is processed into a desired shape. This will be described hereinafter.

FIGS. 17 to 20 are sectional views showing a method of producing a semiconductor storage device described in JP(A)-2000-353791 in order of steps, and FIG. 21 is a sectional view along line Z-Z' of FIG. 20. This semiconductor storage device has a circuit including an NMOS switching transistor 121 formed on the surface of a P-type silicon substrate 120, and is prepared by a CMOS process which has heretofore been known. First, an $N^+$ region 122 is formed in a surface portion of the P-type silicon substrate 120, and an insulating region 123 for element separation is formed. A polysilicon layer 124 forming a gate region is deposited, and a metal layer 125 is formed on the $N^+$ region 122 and the polysilicon layer 124. A conductive layer 126 and a plug conductor 128 are formed on the metal layer 125, and thereafter a dielectric material 127 is charged. A lower-layer wiring is constituted of a conductive metal layer 132 and a digit wire 133 surrounded with a high-permeability layer 131, buried in an etching stop layer 129 and a silicon dioxide layer 130, and flattened. A dielectric layer 134 is deposited in such a manner as to cover the digit wire 133 and the silicon dioxide layer 130, and a conductive layer 135 is deposited in such a manner as to cover the dielectric layer 134 and the conductive metal layer 132. The dielectric layer 134 is disposed between the digit wire 133 and the conductive layer 135 to electrically separate the wire from the layer. The dielectric layer 134 is partially etched in order to form a window 136 for use in electrically connecting the plug conductor 128 to the conductive layer 135 via the conductive metal layer 132 in the conductive metal layer 132. After forming the window 136, the conductive layer 135 is deposited in such a manner as to cover the dielectric layer 134 and the conductive metal layer 132 by a thickness of about 50 nm. The surface of the conductive layer 135 is flattened by the CMP or the like in order to form a magnetic memory element on the conductive layer 135 (FIG. 17).

Next, a plurality of magnetic memory element blanket layers or magnetic memory blanket layers for forming a magnetic memory element are deposited on the surface of the conductive layer 135 by one of a physical deposition process, a chemical deposition process, or an ion beam deposition process. Magnetic materials such as alloys of Ni, Fe and/or Co are used in a bottom magnetic layer 140 and an upper magnetic layer 142 constituting the magnetic memory element. On the other hand, materials such as $Al_2O_3$ and Cu are used in a nonmagnetic layer 141 disposed between the bottom magnetic layer 140 and the upper magnetic layer 142. The bottom magnetic layer 140 functions, for example, as a hard magnetic layer, the direction of the magnetization thereof is fixed, and the direction of the magnetization of the upper magnetic layer 142 is free. The nonmagnetic layer 141 is formed by the following method. An aluminum film is deposited to cover the bottom magnetic layer 140, and thereafter the aluminum film is oxidized by an oxidation source by an RF producing oxygen plasma. In another method, aluminum is deposited together with oxygen on the nonmagnetic layer 140, and thereafter an oxidation process is executed in a heated or non-heated oxygen atmosphere. The layers in the magnetic memory element are very thin, for example, the thickness of the magnetic layer is 0.3 to 20 nm, and the thickness of the nonmagnetic layer is 0.3 to 10 nm. Next, a masking layer 143 is deposited to cover the upper magnetic layer 142 (FIG. 18).

A mask pattern obtained by patterning this masking layer 143 is formed on the upper magnetic layer 142, and the dielectric layer 134 is etched using this pattern as a mask. The conductive layer 135 electrically connects the magnetic memory element to the transistor 121 via the plug conductor 128. The conductive layer 135 is separated from the digit wire 133 by the dielectric layer 134. Next, a new mask pattern is formed on the masking layer 143. Moreover, this is used as a mask, the masking layer 143 and the blanket layers 140 to 142 are etched using a reactive ion etching process, a plurality of magnetic memory elements 144 are electrically defined, and further a plurality of contact metal pads (or conductive wires) 145 are formed. Following the formation of the plurality of contact metal pads 145, a part of the upper magnetic layer 142 is changed into a material having dielectric characteristics using one of an oxidation process and a nitriding process. In further detail, a selected region of the upper magnetic layer 142 is changed into an insulating material to form an inactive portion 142b. In a process of changing the upper magnetic layer 142 into a dielectric insulator, the contact metal pads 145 function as masks. As a result, after oxidation or nitriding, a plurality of active regions 142a are defined, and a new insulating portion (inactive portion 142b) is disposed (FIG. 19). The oxidation or nitriding process is used to change exposed portions of the blanket layers 140 to 142, accordingly these portions are changed to insulating materials, and the portions are set to be inactive.

After completing the oxidation or the nitriding of the upper magnetic layer 142 for forming the magnetic memory elements or the cells 144 as shown, a dielectric layer 146 is deposited in such a manner as to cover the magnetic memory elements 144 and the inactive portion 142b of the upper magnetic layer 142. Next, an etching stop layer 147 is deposited on the dielectric layer 146, and further a silicon dioxide layer 148 is deposited on the etching stop layer 147. Next, a mask (not shown) is patterned and formed on the silicon dioxide layer 148, and a trench for forming a bit line 149 is formed. The silicon dioxide layer 148 is etched to the etching stop layer 147 in accordance with the mask, and a trench for burying the bit line 149 is formed. Next, a Permalloy layer 150 is deposited on the silicon dioxide layer 148 and in the trench. The Permalloy layer 150 is etched by anisotropic etching, the Permalloy layer 150 is left on the side wall of the trench, and the Permalloy layer 150 is also left on the silicon dioxide layer 148 and a bottom part of the trench. After forming the Permalloy layer 150, an electrically conductive layer constituting the bit line 149 is deposited on the surface of a conductive line (contact metal pad 145) via the Permalloy layer 150. That is, a metal such as Al, W, or Cu is charged into the trench in order to form the bit line 149. Next, an unnecessary material on the silicon dioxide layer 148 is removed, and the surfaces of the silicon dioxide layer 148 and the bit line 149 are polished into flat surfaces. Finally, a Permalloy layer 151 is deposited and patterned on the silicon dioxide layer 148 and the bit line 149 (FIGS. 20, 21). The Permalloy layers 150, 151 envelop the bit line 149, accordingly a magnetic field produced by a bit current in the bit line 149 is concentrated on the magnetic memory elements 144, and other magnetic memory elements are shielded to protect information therein.

An operation method using two system wirings and transistors is similar to the above-described method.

However, with the above-described conventional memory structure, it has been difficult to enlarge a capacity, a large writing current has been required, and it has been difficult to reduce power consumption. Reasons for this will be described hereinafter.

A current is passed through a wiring to produce the magnetic field in order to change a magnetized state of the TMR. A magnitude of the magnetic field is inversely proportional to a distance from the wiring. Therefore, the wiring is brought as close to the TMR as possible. In the lifting-off method, they can be approached, but miniaturization is difficult in this technique, and it is difficult to enlarge the capacity. In the method of making the via-hole, since the distance is increased by the thickness of the insulation film on the TMR, it is difficult to reduce a writing current. In the method of heading the TMR by the CMP, the upper electrode needs to be left in a certain thickness so that the TMR itself is not polished in consideration of fluctuation of a polishing amount in a wafer plane. Therefore, the wiring is distant from the TMR by the thickness, and it is difficult to reduce the write current. In the method shown in FIGS. 17 to 21, the distance between the wiring and the TMR is increased by the thickness of the contact metal pad 145, and it is difficult to reduce the write current. Although the dielectric layer 146 and the etching stop layer 147 are formed after forming the contact metal pad 145, in FIG. 20, these layers are removed only on the contact metal pad 145. In actual, it is presumed that methods such as CMP and etching after deposition of the dielectric layer 146, and CMP after deposition of the etching stop layer 147 are used. However, when the methods are used, the contact metal pad 145 needs to be formed in a sufficient thickness.

Thus, there has been a problem that it is difficult to increase the capacity and decrease power consumption in the conventional techniques.

DISCLOSURE OF THE INVENTION

An object of the present invention is to provide a semiconductor storage device capable of disposing a magnetic element such as a TMR and a wiring in the vicinity, so that capacity can be increased and power consumption can be reduced, and a method of producing the device.

Moreover, another object of the present invention is to provide a semiconductor storage device capable of efficiently giving a magnetic field produced by a wiring current to a TMR, and a method of producing the device.

In order to attain the above object, according to the present invention there is provided a semiconductor storage device comprising: a first conductor wiring; a second conductor wiring laid above the first conductor wiring in such a manner as to intersect with the first conductor wiring; and a magnetic element disposed at an intersecting portion formed by the intersection of the first and second conductor wirings, wherein a region constituted of a high-resistance converted material of a constituting material of a film constituting the magnetic element, or a high-resistance converted material of the constituting material of the film constituting the magnetic element and a constituting material of a conductive film formed on at least one of upper and lower portions of the film is formed adjacent to the magnetic element in at least a part of a film thickness.

In an aspect of the present invention, a plurality of magnetic elements are disposed, and the region constituted of the high-resistance converted material is at least a part of a region between adjacent magnetic elements.

In an aspect of the present invention, the region constituted of the high-resistance converted material entirely exists between adjacent magnetic elements.

In an aspect of the present invention, the magnetic element is positioned between the first and second conductor wirings.

In an aspect of the present invention, the high-resistance converted material is oxide, nitride, or oxynitride of a constituting material of a film constituting the magnetic element, or oxide, nitride, or oxynitride of the constituting material of the film constituting the magnetic element, and a constituting material of the conductive film.

In an aspect of the present invention, the high-resistance converted material is formed of all films which are not patterned when defining a region of the magnetic element.

In an aspect of the present invention, a mask member used for forming the high-resistance converted material is formed as at least a part of an upper electrode for the magnetic element on the magnetic element.

In an aspect of the present invention, the mask member is formed including a layer constituted of titanium nitride, aluminum, aluminum alloy, platinum, iridium, gold, ruthenium, or indium.

In an aspect of the present invention, an upper electrode is formed on the magnetic element, and the second conductor wiring is formed in contact with the upper surface and at least two side surfaces facing each other of the upper electrode.

In an aspect of the present invention, an uppermost layer of the first conductor wiring is formed of a conductive material in which oxidation does not easily proceed as compared with a main component of the wiring.

In an aspect of the present invention, the uppermost layer of the first conductor wiring is formed of aluminum or titanium nitride.

In an aspect of the present invention, a tunnel insulation film is formed between the magnetic element and the wiring formed below the element and/or above the element.

In an aspect of the present invention, the tunnel insulation film comprises a plurality of insulation films having different dielectric constant.

In an aspect of the present invention, an uppermost layer of the conductive film formed below a film constituting the magnetic element, and/or a lowermost layer of the conductive film formed above the film constituting the magnetic element is formed of a material other than tantalum, which indicates a high resistance value when oxidized.

In an aspect of the present invention, the material which indicates the high resistance value when oxidized is silicon or zirconium.

In an aspect of the present invention, a part of the high-resistance converted material is removed without extending a total film thickness, and a removed space is filled with a deposited insulating material.

In an aspect of the present invention, at least one of the first and second conductor wirings has a first wiring layer formed by removing a part of a conductive film formed on a flat region, and a second wiring layer formed by filling in a trench of an insulation film in which the trench is formed above the first wiring layer.

In an aspect of the present invention, the magnetic element contains a metal material including FeMn, NiMn, IrMn, or PtMn as a main component.

In an aspect of the present invention, a magnetic layer is attached to at least one of the first and second conductor wirings in at least a part of a portion other than a portion facing the magnetic element.

In an aspect of the present invention, the magnetic layer attached to the side surface of the second conductor wiring is positioned in contact with a region constituted of the high-resistance converted material or at a distance of 20 nm or less from the region.

In an aspect of the present invention, the magnetic layer attached to the side surface of the second conductor wiring is formed by a film deposition and anisotropic etching.

In an aspect of the present invention, at least some of magnetic films constituting the magnetic element are formed in contact with the conductive film, and a region constituted of the high-resistance converted material is formed of oxide, nitride, or oxynitride of a synthetic material of a constituting material of the conductive film and a constituting material of at least some of films constituting the magnetic element.

In an aspect of the present invention, the conductive film is formed of a material containing at least one of tantalum, aluminum, silicon, zirconium, cerium, and hafnium.

In an aspect of the present invention, a region formed of oxide, nitride, or oxynitride is formed above a boundary portion between the magnetic element and the region constituted of the high-resistance converted material, and the region constituted of the high-resistance converted material is formed of oxide, nitride, or oxynitride of a synthetic material of a constituting material of a region formed of oxide, nitride, or oxynitride and a constituting material of at least some of films constituting the magnetic element.

In an aspect of the present invention, the region formed of oxide, nitride, or oxynitride is formed of a material including at least one of tantalum, aluminum, silicon, zirconium, cerium, and hafnium.

In an aspect of the present invention, the region constituted of the high-resistance converted material comprises films corresponding to all films constituting the magnetic element.

In an aspect of the present invention, the region constituted of the high-resistance converted material comprises films corresponding to some of films constituting the magnetic element, a film having conductivity equal to that of other films constituting the magnetic element is disposed under the region constituted of the high-resistance converted material, and the magnetic element is electrically connected to the other magnetic element by the film having the conductivity in a direction of the first conductor wiring.

In an aspect of the present invention, the region constituted of the high-resistance converted material is formed of oxide, nitride, or oxynitride containing as main component a constituting material of at least some of films constituting the magnetic element, a magnetic film is formed on the surface of the second conductor wiring opposite to the surface thereof facing the magnetic element, and a flat-surface shape of the magnetic film is analogous to that of the magnetic element.

In an aspect of the present invention, a pair of magnetic films are formed in such a manner as to hold the magnetic element between the second conductor wiring and the magnetic element.

In an aspect of the present invention, a plurality of layers of the above structure are stacked.

According to the present invention there is provided a semiconductor storage device comprising: a first wiring layer formed by removing a part of a conductive film formed on a flat region; a first insulation film charged between first wiring layers; a second insulation film formed on the first insulation film and having a trench in which at least a part of the surface of the first wiring layer is exposed; and a second wiring layer buried in the trench of the second insulation film.

In order to attain the above object, according to the present invention there is provided a method of producing a semiconductor storage device, comprising: a step of depositing a magnetic element forming film on a flat surface to which the surface of a lower-layer conductive film is exposed; a step of forming a mask on the magnetic element forming film; and a step of converting the magnetic element forming film of a region which is not protected by the mask into a high-resistance converted material to form an isolated magnetic element under the mask.

In an aspect of the present invention, the step of converting the magnetic element forming film of the region which is not protected by the mask into the high-resistance converted material is performed by oxidation, nitriding, or oxynitriding.

In an aspect of the present invention, the oxidation, nitriding, or oxynitriding includes: a process of ion-implanting a material containing an oxygen atom and/or a nitrogen atom into the magnetic element forming film of the region which is not protected by the mask; and/or a process of bringing ion, radical, or ozone of the atom into contact with the magnetic element forming film of the region which is not protected by the mask at high temperature.

In an aspect of the present invention, a conductive film is formed on at least one of upper and lower portions of the magnetic element forming film in the step of depositing the magnetic element forming film, and the magnetic element forming film including at least a part of the conductive film is oxidized, nitrided or oxynitrided in the step of forming the magnetic element, to thereby convert the magnetic element forming film into the high-resistance converted material.

In an aspect of the present invention, the method further comprises the steps of: introducing an atom which is easy to insulate into the magnetic element forming film of the region which is not protected by the mask before the step of converting the magnetic element forming film of the region which is not protected by the mask into the high-resistance converted material.

In an aspect of the present invention, the atom which is easy to insulate is one or a plurality of silicon, zirconium, cerium, and hafnium.

In an aspect of the present invention, the method further comprises the steps of: introducing an atom which is not converted into a ferromagnetic material by the step of converting the film into the high-resistance converted material into the magnetic element forming film of the region which is not protected by the mask before the step of converting the magnetic element forming film of the region which is not protected by the mask into the high-resistance converted material.

In an aspect of the present invention, a method of introducing the atom which is easy to insulate or which is not converted into the ferromagnetic material is an ion implantation method, or a method of forming a film containing the atom on the magnetic element forming film to diffuse the atom at high temperature, or apply another atom or molecule to the surface of the film to implant a film component.

In an aspect of the present invention, the method further comprises: a step of storing the material in an oxygen and/or nitrogen atmosphere at high temperature after the step of converting the magnetic element forming film of the region which is not protected by the mask into the high-resistance converted material.

In an aspect of the present invention, the method further comprises: a step of removing at least a part of the mask after the step of converting the magnetic element forming film of the region which is not protected by the mask into the high-resistance converted material.

In an aspect of the present invention, the method further comprises: a step of removing a part or all of the formed high-resistance converted material, and filling the removed space with a deposited insulating material after the step of converting the magnetic element forming film of the region which is not protected by the mask into the high-resistance converted material.

In an aspect of the present invention, the method further comprises: a step of forming an insulation film on the whole surface; a step of forming a wiring trench in the insulation film; and a step of filling the wiring trench with a conductive material to form an upper-layer wiring electrically connected to the magnetic element after the step of converting the magnetic element forming film of the region which is not protected by the mask into the high-resistance converted material.

In an aspect of the present invention, the method further comprises: a step of forming an upper-layer wiring electrically connected to the magnetic element; a step of removing a part of the high-resistance converted material using the upper-layer wiring as the mask to form an insulated trench; and a step of forming a filling insulation film to fill in the insulated trench and between the upper-layer wirings after the step of converting the magnetic element forming film of the region which is not protected by the mask into the high-resistance converted material.

In a conventional method shown, for example, in FIGS. 17 to 21, a film (blanket film) forming a magnetic element such as a TMR is etched twice to remove a portion between the magnetic elements, further individual patterns of magnetic element cells are defined by an insulating process of the film forming the magnetic element, further lithography is required on a concave/convex surface, therefore miniaturization is difficult, and the method is unsuitable for enlargement of the capacity. On the other hand, according to the present invention, it is possible to define the pattern of the magnetic element by performing the lithography once on a flat surface, and the magnetic element can be formed by a process suitable for miniaturization. Moreover, after forming the magnetic element, an electrode (mask) of the magnetic element can be protruded from the flat surface, it is therefore possible to form an upper wiring in such a manner as to envelop the magnetic element electrode, and accordingly the wiring can be disposed in the vicinity of the magnetic element. As a result, an effect that the writing current can be reduced is obtained, and enlargement of the capacity of the semiconductor storage device and reduction of the power consumption can be realized.

BRIEF DESCRIPTION OF THE DRAWINGS

FIG. 10A is a sectional view of a production step of the semiconductor storage device according to the first example of the present invention;

FIG. 10B is a sectional view of the production step of the semiconductor storage device according to the first example of the present invention;

FIG. 10C is a sectional view of the production step of the semiconductor storage device according to the first example of the present invention;

FIG. 10D is a sectional view of the production step of the semiconductor storage device according to the first example of the present invention;

FIG. 10E is a sectional view of the production step of the semiconductor storage device according to the first example of the present invention;

FIG. 10F is a sectional view of the production step of the semiconductor storage device according to the first example of the present invention;

FIG. 17 is a production step sectional view of the conventional semiconductor storage device;

FIG. 18 is a production step sectional view of the conventional semiconductor storage device;

BEST MODE FOR CARRYING OUT THE INVENTION

Embodiments of the present invention will be described in detail with reference to the drawings.

First Embodiment

Figure 1:
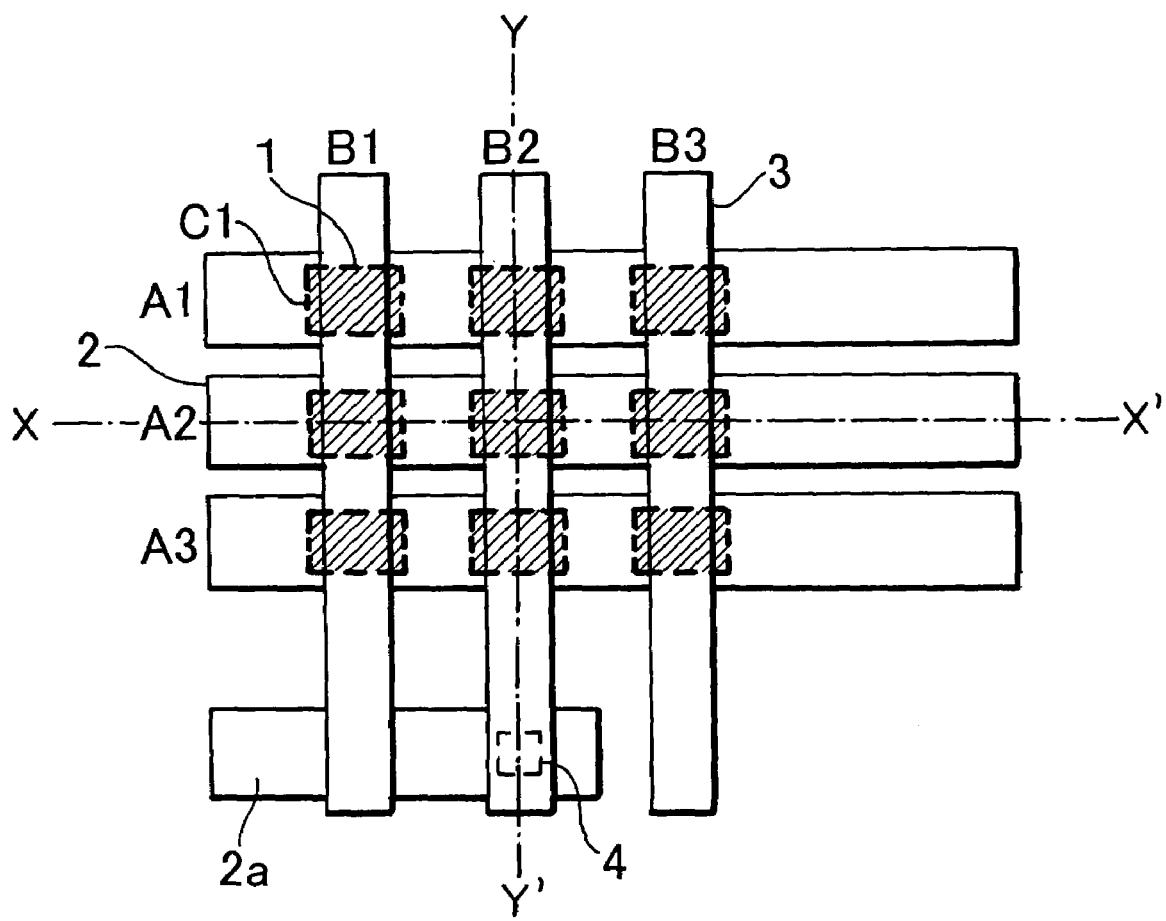
FIG. 1 is a schematic plan view showing a semiconductor storage device of a first embodiment of the present invention.
Figure 2A:
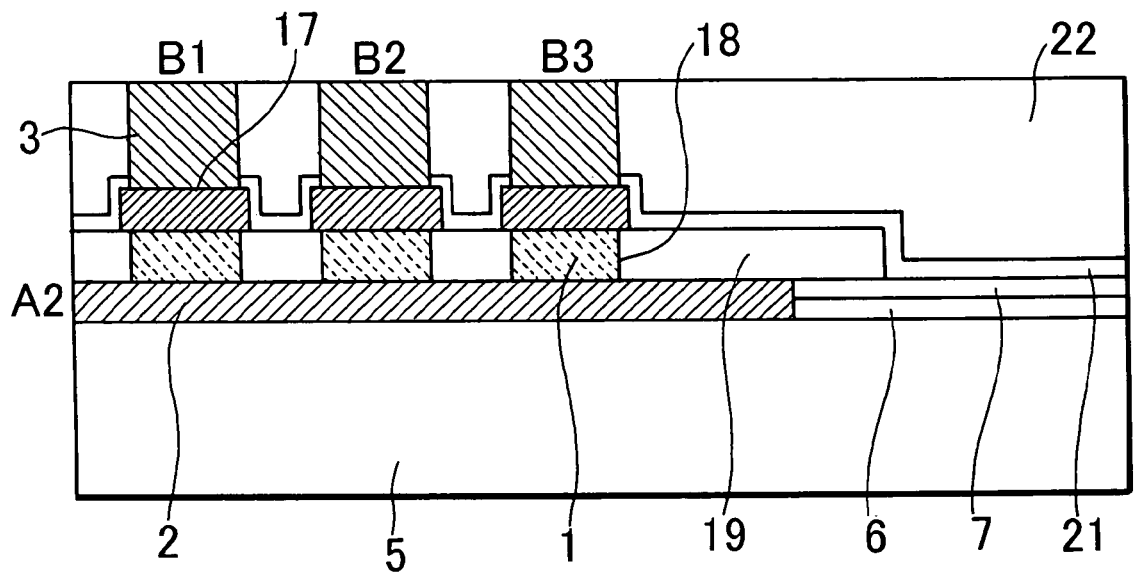
FIG. 2A is a sectional view along line X-X' of FIG. 1.
Figure 2B:
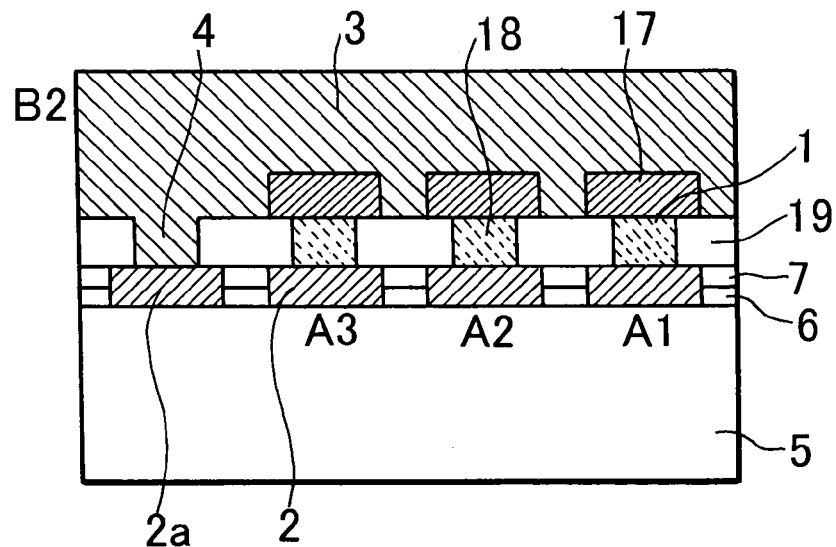
FIG. 2B is a sectional view along line Y-Y' of FIG. 1.
Figure 3:
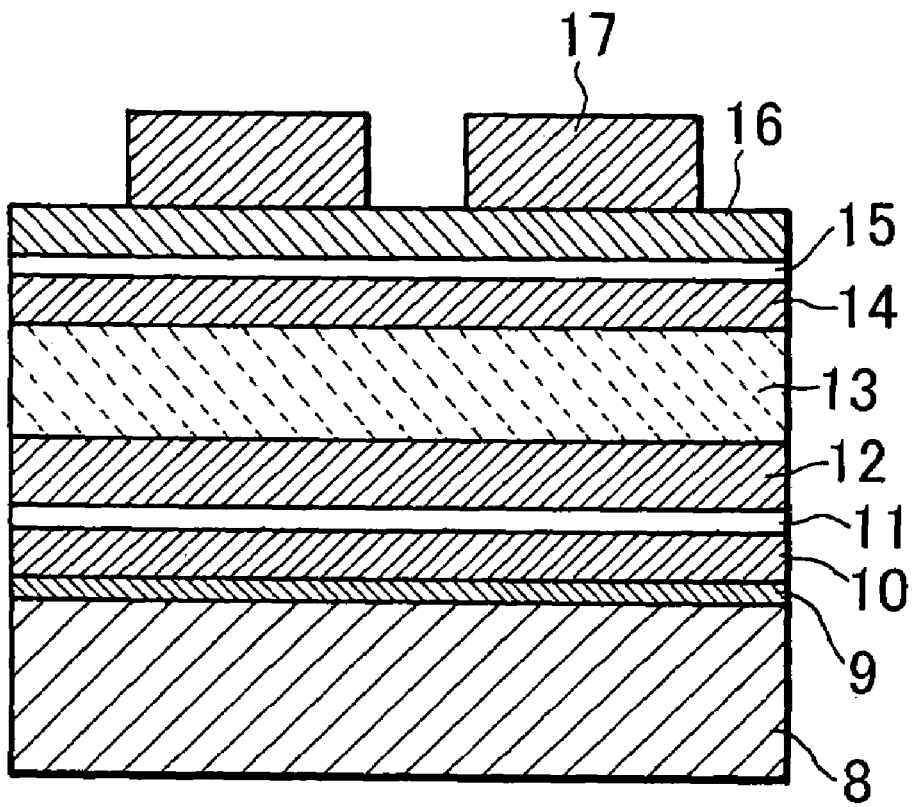
FIG. 3 is a sectional view showing a method of forming a magnetic element according to the first embodiment of the present invention.

FIG. 1 shows a main part plan view of a semiconductor storage device according to a first embodiment of the present invention. As shown in FIG. 1, the semiconductor storage device has a plurality of magnetic elements 1, writing wiring A (A1 to A3):2 of two systems disposed in the vicinity of the respective magnetic elements, and wiring B (B1 to B3):3. Directions of the writing wirings A:2 of two systems and the wirings B:3 are different from each other. FIGS. 2A and 2B show sections of a wiring A direction (X-X' line direction) and a wiring B direction (Y-Y' line direction) of FIG. 1. Electric circuits are formed in a layer below (lower layer: not shown) and a layer above (upper layer: not shown) a constitution shown in FIGS. 2A and 2B, and the electric circuit is electrically connected to the magnetic elements described with reference to these figures to control operations of the magnetic elements. In the semiconductor storage device described in the embodiment of the present invention, the wiring A:2 intersects with the wiring B:3 in the plan view of FIG. 1 (this mode is referred to as an intersected mode in the present description), and magnetic elements 1 such as TMRs are disposed on intersecting portions. In the embodiment of the present invention, the magnetic element 1 is in a position held between the wirings A and B, the wiring B is electrically connected to the upper part of the magnetic element 1, and the wiring A is electrically connected to the lower part of the magnetic element 1. The wiring B:3 (B2) is connected to a leader line 2a of the same layer as that of the wiring A:2 via a via-hole 4. FIG. 3 shows a partial sectional view of a state in which the magnetic element described in the embodiment of the present invention is being formed.

Next, a method of producing the semiconductor storage device will be described with reference to FIGS. 1 to 3. After forming an element such as a transistor or a lower wiring constituting the electric circuit on a semiconductor substrate (not shown), an insulation film 5 which contains a plug (not shown) for electric connection to the lower wiring and whose surface is flattened by CMP and the like is formed. Thereafter, an etching stop film 6 and an insulation film 7 are formed on the whole surface of the insulation film 5 in order, the insulation film 7 of a portion in which the wiring is disposed is removed, further the etching stop film 6 exposed to this wiring laying portion is removed, and the plug surface is exposed (see FIGS. 2A and 2B).

Next, a conductor film 8 and a conductor oxidation preventive film 9 shown in FIG. 3 are formed in order by a sputtering process. Wiring materials (conductor film 8 and conductor oxidation preventive film 9) other than the wiring laying portion are removed by the CMP or the like, and the conductor film 8 and the conductor oxidation preventive film 9 constituting the wiring A:2 are left. The wiring A:2 of FIGS. 1, 2A, and 2B corresponds to a laminate of the conductor film 8 and the conductor oxidation preventive film 9 of FIG. 3. Subsequently, a conductor film 10, a tunnel film 11, a magnetic element lower-layer film 12, a magnetic element forming film 13, a magnetic element upper-layer film 14, a tunnel film 15, a conductor film 16, and a mask material layer (17) formed of a metal in which oxidation does not easily proceed are successively formed. The magnetic element lower-layer film 12 is inserted in order to achieve a satisfactory characteristic of the magnetic element (13), and may be omitted. The magnetic element upper-layer film 14 is formed on the magnetic element in order to protect the surface of the magnetic element forming film 13, and may be omitted. The magnetic element forming film 13 is a portion whose characteristic changes with a change of a magnetized state, and constitutes a main constituting portion of the magnetic element 1. As described later, the tunnel film 15 may be omitted. Each of the conductor film 10 and the conductor film 16 functions as a part of a lower or upper electrode of the magnetic element 1, and may be omitted. Each of the magnetic element lower-layer film 12 and the magnetic element upper-layer film 14 also functions as a part of the lower or upper electrode of the magnetic element 1.

Thereafter, the mask material layer is processed into a desired shape to form the mask 17. At this time, the vicinity of the magnetic element forming film 13 may be worked into the same pattern as that of the mask material layer. The mask 17 functions as a part of the upper electrode.

Next, the whole surface is treated by oxygen plasma or the like, and the conductor film 10, tunnel film 11, magnetic element lower-layer film 12, magnetic element forming film 13, magnetic element upper-layer film 14, tunnel film 15, and conductor film 16 of a portion which is not covered with the mask 17 are insulated (see FIG. 3). Accordingly, an insulated region 19 in which the magnetic element forming film 13 and a layer (layer above the conductor oxidation preventive film 9) positioned under at least the film are insulated, and a magnetic element region 18 [corresponding to the magnetic element 1 (C1) of FIG. 1] separated and isolated by the insulated region 19 are formed. The insulating does not have to be completely performed to the conductor film 10, and may be performed so as to achieve in a high-resistance state to such an extent that a leakage current between cells does not raise any problem in a circuit operation. Next, the insulated region 19 of a connected portion of the leader line 2a formed in the same layer as that of the wiring A:2 to the wiring B:3 formed above the magnetic element region 18 is removed, and the via-hole 4 for exposing the surface of the leader line 2a is formed [see FIGS. 1 and 2B].

Next, the insulated region 19 which is a region outside a cell array is partially removed to expose the insulation film 7. Next, an etching stop film 21 and an insulation film 22 are formed on the whole surface in order, and flattened. Next, a trench is formed in the insulation film 22 in accordance with a shape (pattern) of the wiring B, and the exposed etching stop film 21 is also removed. After removing the surface insulated material of the mask 17, the material of the wiring B is formed into a film. When wiring materials other than a wiring portion are removed by the CMP or the like, the wiring B:3 is formed.

Thereafter, the above-described steps are further repeated, and the wirings and magnetic elements can be formed into multi-layers.

Figure 4A:
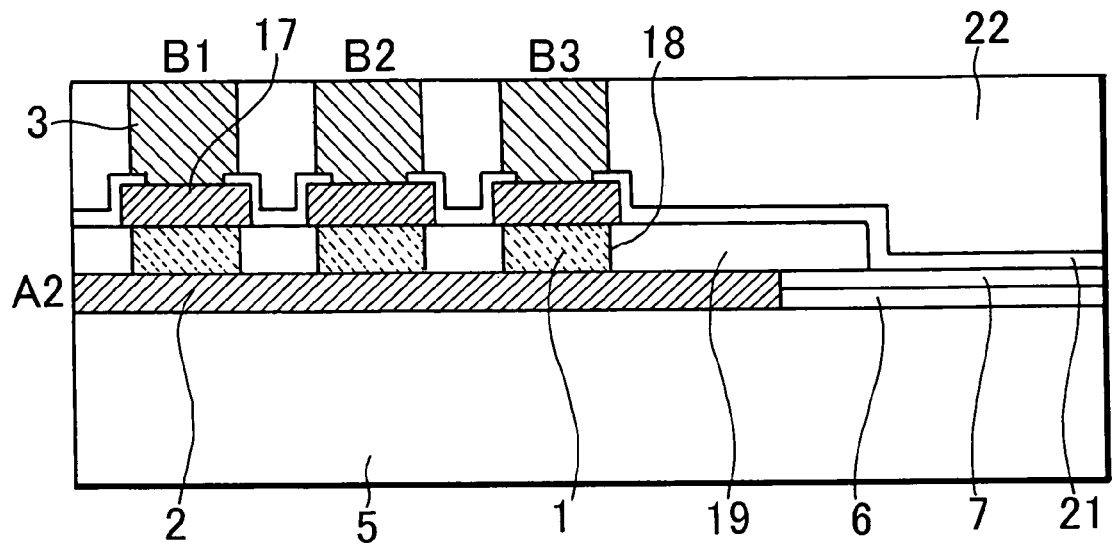
FIG. 4A is a sectional view corresponding to a sectional view along line X-X' of FIG. 1, showing a modification of the first embodiment of the present invention.
Figure 4B:
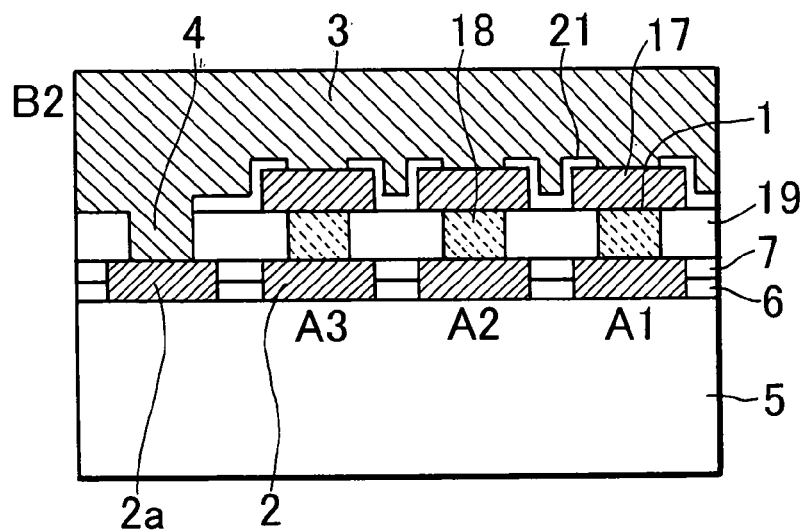
FIG. 4B is a sectional view corresponding to a sectional view along line Y-Y' of FIG. 1, showing a modification of the first embodiment of the present invention.

When the etching stop film 21 is removed before forming the film of the wiring B, a partial region of the upper surface of the mask 17 and a region including the via-hole 4 only may be removed. In this case, sectional structures are shown in FIGS. 4A and 4B. FIG. 4A is a sectional view along line X-X' of FIG. 1, and FIG. 4B is a sectional view along line Y-Y' of FIG. 1.

Figure 4C:
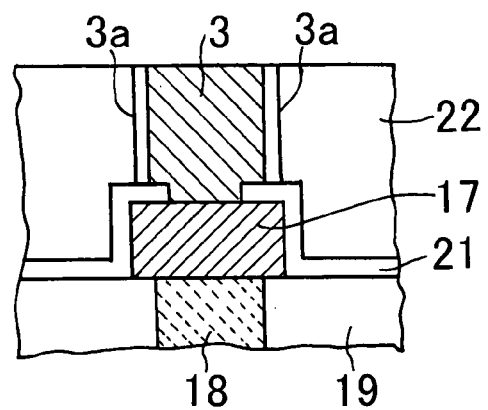
FIG. 4C is a partial sectional view showing a further modification with respect to the modifications of FIGS. 4A and 4B.

After partially removing the etching stop film 21, a magnetic film is deposited on the whole surface, a flat portion is removed by etching-back, subsequently a conductive film (wiring material) is deposited and flattened to remove the wiring material of an unnecessary portion, and accordingly the wiring B:3 in which magnetic films 3a are disposed on side-wall portions can be formed [see FIG. 4C]. Alternatively, a laminate film of the magnetic film with an insulation film for separating the magnetic film from the conductive film, or a laminate film of the magnetic film with the conductive film constituting a barrier metal is formed, a flat portion thereof is removed by the etching-back, and subsequently the conductive film may be deposited and flattened. Even in the semiconductor storage device shown in FIGS. 2A and 2B, the magnetic films can be similarly formed on the side walls of the insulation film 22 on which the wiring B is formed.

After insulating the periphery of the magnetic element, a part of the insulated region 19 may be subsequently removed. In this case, since the insulated material is removed, short-circuit does not occur even when the removed materials stick again. To enhance insulation between adjacent wirings, after forming the wiring B, a shape of the wiring B is left, the insulation film 22 and etching stop film 21 are removed, and further a part or all of the insulated region 19 may be removed. Also in this case, the insulated material is removed, and therefore the short-circuit does not occur even when the removed materials stick again. In this case, after removing the insulated material, an insulation film is deposited anew, and a region between the magnetic elements 1 and a region between the wirings B are filled. To facilitate the insulating around the magnetic element, after forming the mask 17, a material containing oxygen and nitrogen atoms may be ion-implanted, and the exposure to a high-temperature atmosphere of ion or radical containing these atoms or ozone. After implanting materials (silicon, zirconium, cerium, hafnium, etc.) which are easy to insulate, the insulating may be performed. To reduce magnetic coupling between the magnetic elements, after forming the mask 17, such atoms that the insulated region 19 does not have any ferromagnetic characteristic through the insulating process may be ion-implanted, a material containing the atoms may be formed into a film and diffused at high temperature, or ions (or atoms or molecules) are applied and pushed in. Using this method, the atoms or ions may be introduced. Examples of the material include Al, Cr which are paramagnetic or antiferromagnetic materials, Cu which is a diamagnetic material and the like. The method of diffusing the material at the high temperature or the method of pushing in the material may be used instead of the ion implantation method when introducing the material which is easy to insulate. The examples of the wiring material include Al, Cu, and a compound thereof.

The conductor oxidation preventive film 9 disposed on a wiring upper-surface portion in such a manner as to prevent the wiring laid under the magnetic element 1 from being insulated can be formed using a conductive material in which oxidation does not easily proceed, for example, TiN or Al. The conductor film 8 itself may be a conductive material which is not easily oxidized or a conductive material in which the oxidation does not easily proceed, and in this case the forming of the conductor oxidation preventive film 9 may be omitted. The tunnel films 11, 15 disposed above/under the magnetic element 1 are formed of films of $SiO_2$ or $Al_2O_3$ having a thickness of about 3 nm. The tunnel film may be omitted, but a current flows in tunnel phenomenon. Therefore, when this film is disposed, any problem does not occur in a magnetic element operation. By the use of a stacked structure tunnel film having two or more layers of different dielectric constant, a nonlinear characteristic can be imparted to the operation of the magnetic element 1. To enhance insulation between the wirings above/under the magnetic element, amorphous silicon, Zr or the like is usable in the conductor films 10, 16 disposed above/under the magnetic element forming film 13 and insulated. All or a part of the conductive film may be omitted, but when the films are used, the current flows through these portions corresponding to the magnetic elements 1, and the insulated portions constitute insulators. When the mask for use in oxidizing the periphery of the magnetic element 1 is formed of a conductor material, materials which are difficult to oxidize and in which the oxidation does not easily proceed, such as TiN, Au, Al, Al alloy, Pt, and Ir, or materials which are conductive even when oxidized, such as Ru, In are preferable. The mask materials may be removed after the insulation. The mask may be an insulator, and in this case, the mask is removed after an element periphery insulating process. The material of the magnetic element forming film 13 preferably comprises atoms which are oxidized or nitrided to constitute the insulator, and the examples of an antiferromagnetic material used include FeMn, NiMn and the like.

Next, a method of using the semiconductor storage device will be described. When magnetized states of the magnetic element disposed in an intersection between the wirings A1 and B1 and the vicinity thereof are changed, the current is passed through the writing wirings A1, B1, and a synthetic magnetic field is imparted to the magnetic element. The magnitude and direction of the synthetic magnetic field are set in accordance with an amount of the current to be passed through two writing wirings, the direction of the current, and the wiring direction, and the magnetic element is brought into a desired magnetized state. The examples of the magnetic element include a magnetoresistive element such as a TMR, and a magneto-optical element. To read a set state, an electric, optical, or mechanical change is imparted to the magnetic element, and a response is detected. To apply a voltage or current, the writing wiring is also used for reading. Light may be applied to detect a difference of intensity between reflected waves.

In this semiconductor storage device, a distance between a wiring above the magnetic element for generating a writing magnetic field, and the magnetic element can be set to be very short. Therefore, the magnetic field generated by the wiring current can be efficiently applied to the magnetic element. Even when the writing current is reduced, a satisfactory writing operation is possible, and an effect that low power consumption can be achieved is brought.

Second Embodiment

Figure 5:
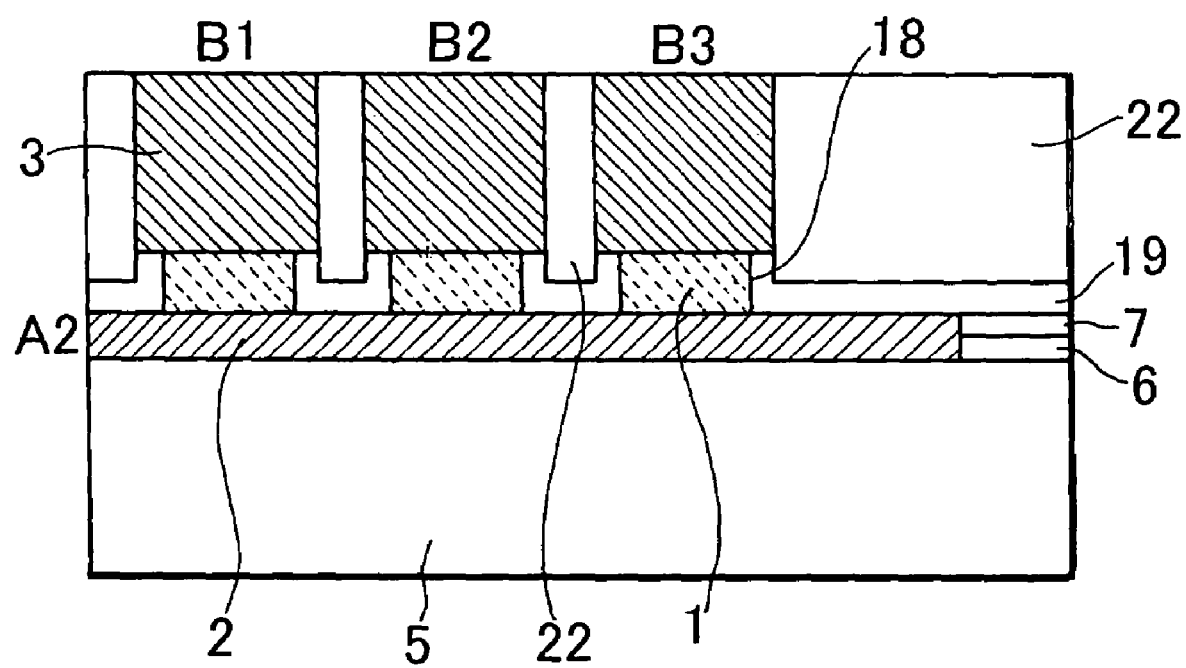
FIG. 5 is a sectional view showing a semiconductor storage device of a second embodiment of the present invention.

FIG. 5 shows a main part sectional view of a semiconductor storage device which is a second embodiment of the present invention. A plan view of the semiconductor storage device of the present embodiment is similar to that of FIG. 1 of the first embodiment, and FIG. 5 corresponds to a sectional view along line X-X' of FIG. 1. As shown in FIG. 5, the semiconductor storage device of the present embodiment has a plurality of magnetic elements 1, and writing wiring A:2 (A2) and writing wiring B:3 (B1 to B3) of two systems disposed above/under each element. Laying directions of the writing wirings A, B of two systems are different from each other. Electric circuits are formed in a layer below (lower layer: not shown) and a layer above (upper layer: not shown) the constitution shown in FIG. 5, and the electric circuits are electrically connected to the shown magnetic elements to control operations of the magnetic elements.

In the semiconductor storage device of the present embodiment, the wiring A:2 intersects with the wiring B:3 as viewed in the plan view, and the magnetic element 1 is disposed in an intersecting portion. In the present embodiment, the magnetic element 1 is in a position held between the wirings A, B, the wiring B:3 is electrically connected to the upper part of the magnetic element 1, and the wiring A:2 is electrically connected to the lower part of the magnetic element 1. The portion of the magnetic element is similar to that of the first embodiment.

Next, a production method will be described. The method is similar to that of the first embodiment up to an insulating process. After the insulating process, a mask (the mask 17 of FIGS. 2A and 2B) is removed, and the material of the wiring B is formed into a film. After forming the wiring B:3 into a desired shape, subsequently an insulated region 19 other than a wiring portion is removed halfway (i.e., the region is partially removed with respect to a thickness direction). Thereafter, an insulation film 22 is formed and then flattened.

In the semiconductor storage device, in addition to the characteristic of the first embodiment, the insulated region is partially removed, and therefore an effect that a leakage current between memory cells (magnetic elements) can be reduced is brought. A method of using the semiconductor storage device is similar to that of the first embodiment.

Figure 6A:
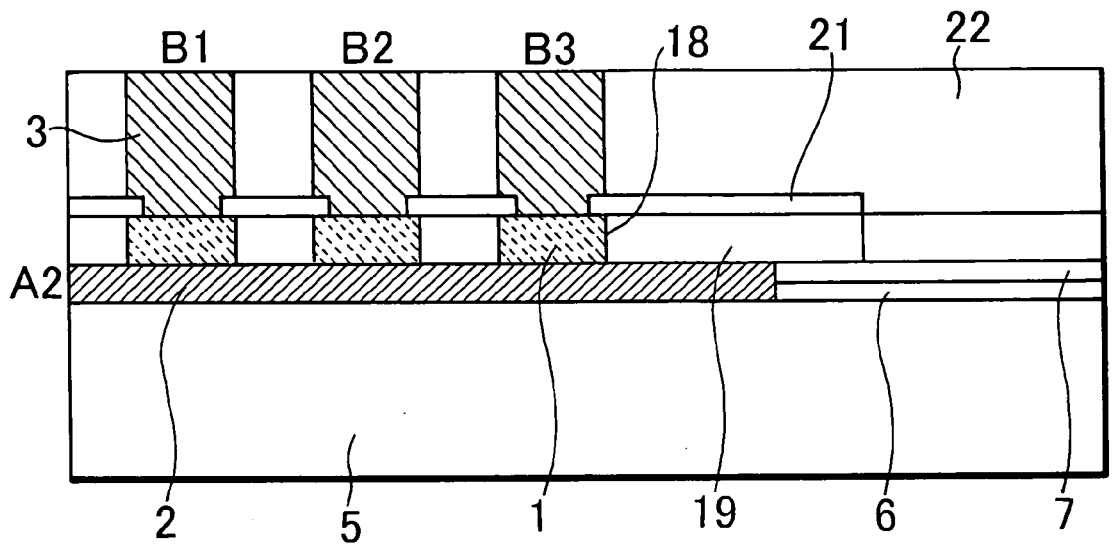
FIG. 6A is a sectional view corresponding to a sectional view along line X-X' of FIG. 1, showing a modification of the second embodiment of the present invention.
Figure 6B:
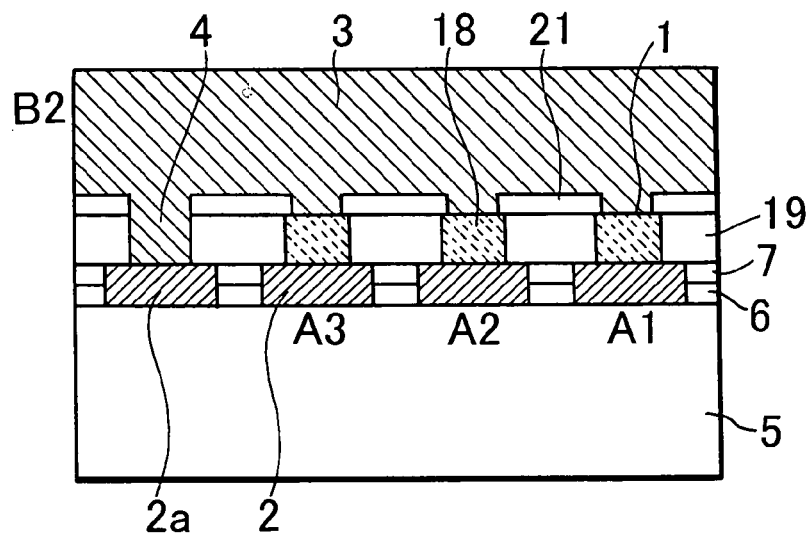
FIG. 6B is a sectional view corresponding to a sectional view along line Y-Y' of FIG. 1, showing a modification of the second embodiment of the present invention.

Before forming the film of the wiring B:3, an insulating etching stop film 21 is formed, and a partial region of the etching stop film 21 on the magnetic element 1 and a region including a via-hole may be removed. In this case, a sectional structure is shown in FIGS. 6A and 6B. FIG. 6A corresponds to a sectional view along line X-X' of FIG. 1, and FIG. 6B corresponds to a sectional view along line Y-Y' of FIG. 1.

Figure 6C:
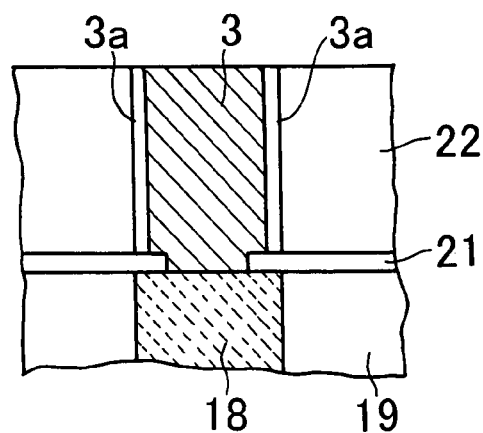
FIG. 6C is a partial sectional view showing a further modification with respect to the modifications of FIGS. 6A and 6B.

After forming the wiring B:3, on the whole surface, a magnetic film, a laminate film of an insulation film for separating the magnetic film from the wiring B with the magnetic film, or a laminate film of a conductive film constituting a barrier metal with the magnetic film is formed, a flat portion is removed by etching-back, and accordingly the wiring B:3 in which magnetic films 3a are disposed on side-wall portions can be formed [see FIG. 6C]. The magnetic film can be similarly formed with respect to the semiconductor storage device shown in FIG. 5. In this case, the magnetic film may be deposited before/after removing a part of the insulated region 19.

Third Embodiment

Figure 7:
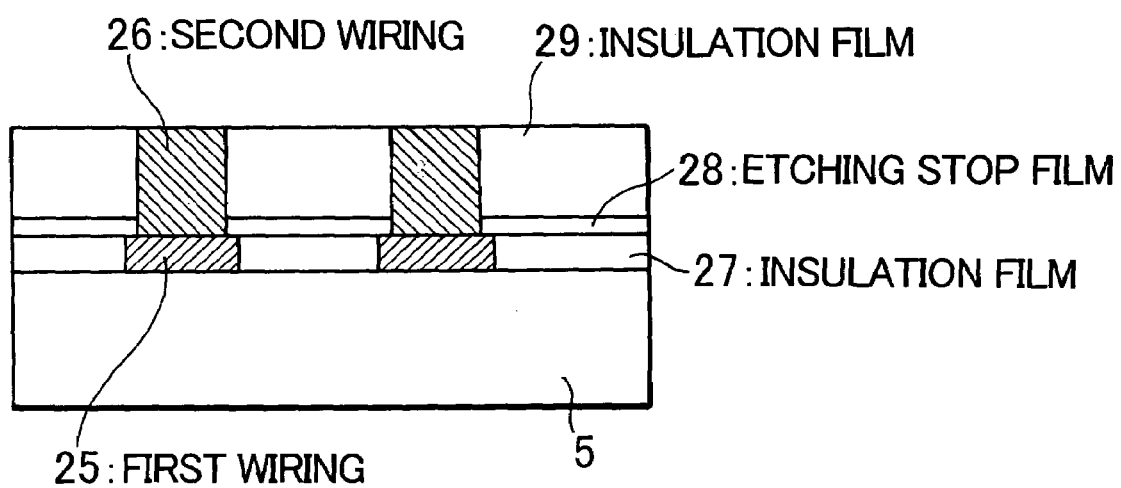
FIG. 7 is a sectional view showing a wiring structure of a semiconductor storage device of a third embodiment of the present invention.

FIG. 7 shows a main part sectional view of a wiring structure of a semiconductor storage device which is a third embodiment of the present invention. A wiring of the semiconductor storage device has a first wiring (wiring film) 25 and a second wiring (wiring film) 26. Two wiring films partially or entirely contact each other, and wiring directions of the wiring films in a contacted portion substantially match each other (i.e., parallel wiring films are brought into close contact). This wiring structure is suitable for a wiring whose necessary portion is thickened. For example, when the structure is applied to the semiconductor storage device, all of the wiring for use in this device, or a portion on the magnetic element or in the vicinity of the magnetic element is thickened. In this case, when two wiring films are brought into close contact, one thick wiring is recognized. Therefore, when a current is passed in a wiring direction, a large amount of current flows in the vicinity of the magnetic element, and a large magnetic field is imparted. This wiring structure is usable in the wiring structure for the semiconductor storage device of the first or second embodiment (FIGS. 2A, 2B, and 5 and the like). The structure is also applicable to a wiring structure of an embodiment described later (FIGS. 9A and 9B, 13A and 13B and the like).

Next, a method of producing the wiring structure of the semiconductor storage device in the present embodiment will be described. After forming an element such as a transistor and a lower-layer wiring on a semiconductor substrate (not shown), an insulation film 5 which contains a plug for electric connection to the lower-layer wiring and whose surface is flattened by CMP or the like is formed. Thereafter, a conductive film for forming a first wiring 25 is deposited on the whole surface of the insulation film, and worked into a desired shape to form the first wiring 25, and thereafter an insulation film 27 is formed on the whole surface. The whole is flattened to expose the first wiring 25. An etching stop film 28 and an insulation film 29 are formed in order on the whole surface, the insulation film 29 of a portion in which a second wiring 26 is disposed is removed, and further the etching stop film 28 exposed at a wiring laying portion is also removed. The material of the second wiring 26 is deposited on the whole surface, and the wiring material other than the wiring laying portion is removed by the CMP or the like to thereby bury/form the second wiring 26 in the insulation film 29.

Since the first wiring film can be formed to be thin in the wiring structure of the semiconductor storage device, an effect that fine working can be realized is brought about as compared with a case where a thick film is worked once.

Fourth Embodiment

Figure 22:
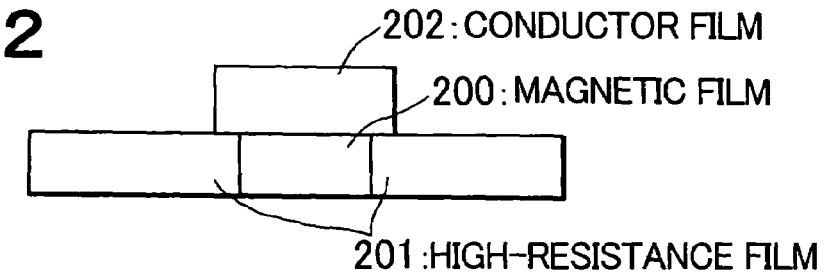
FIG. 22 is a main part sectional view of the semiconductor storage device according to a fourth embodiment of the present invention.

FIG. 22 shows a main sectional view of a semiconductor storage device according to a fourth embodiment of the present invention.

The present embodiment has a magnetic film 200 having a desired shape, a high-resistance film 201 adjacent to the magnetic film, and a conductor film 202 worked into a desired shape. One surface of the magnetic film 200 contacts that of the conductor film 202. The high-resistance film 201 is oxide, nitride, or oxynitride of a composite material formed of at least a part of the material of each of the magnetic film 200 and the conductor film 202.

Fifth Embodiment

Figure 23:
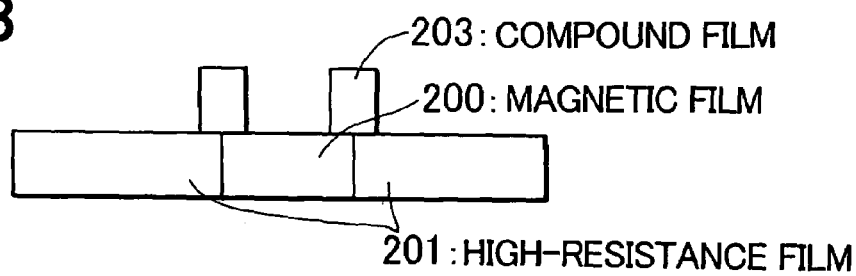
FIG. 23 is a main part sectional view of the semiconductor storage device according to a fifth embodiment of the present invention.

FIG. 23 shows a main sectional view of a semiconductor storage device according to a fifth embodiment of the present invention.

The present embodiment has a magnetic film 200 having a desired shape, a high-resistance film 201 adjacent to the magnetic film, and a compound film 203. The compound film 203 is disposed in the vicinity of a boundary between the magnetic film 200 and the high-resistance film 201. At least a part of one surface of the compound film 203 contacts the high-resistance film 201. The high-resistance film 201 is oxide, nitride, or oxynitride of a composite material formed of at least a part of the material of each of the magnetic film 200 and the compound film 203.

Sixth Embodiment

Figure 24:
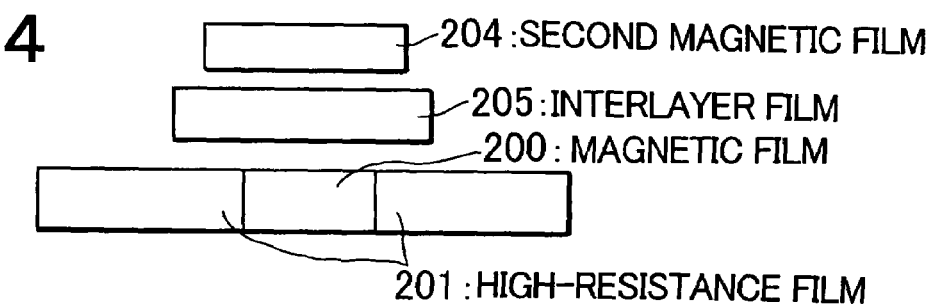
FIG. 24 is a main part sectional view of the semiconductor storage device according to a sixth embodiment of the present invention.

FIG. 24 shows a main sectional view of a semiconductor storage device according to a sixth embodiment of the present invention.

The present embodiment has a first magnetic film 200 having a desired shape, a high-resistance film 201 adjacent to the first magnetic film, a second magnetic film 204 having a desired shape, and an interlayer film 205. The magnetic film 200 is disposed facing one surface of the interlayer film 205, and the other surface of the interlayer film 205 is disposed facing the second magnetic film 204. The high-resistance film 201 is oxide, nitride, or oxynitride containing at least a part of the material of the first magnetic film 200. The interlayer film 205 may be a conductor. The first magnetic film 200 and the second magnetic film 204 may be formed into analogous shapes in a self-matching manner.

Seventh Embodiment

Figure 25:
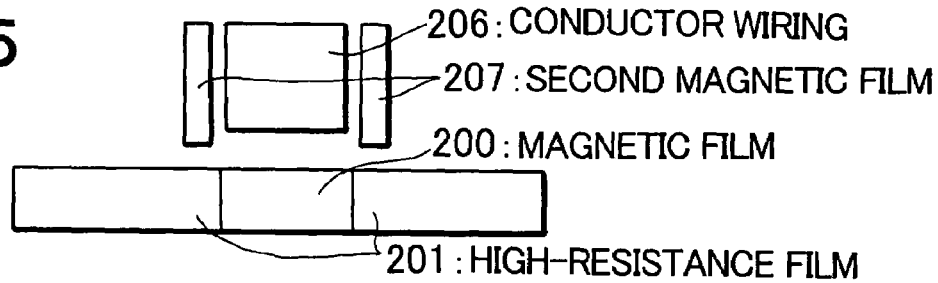
FIG. 25 is a main part sectional view of the semiconductor storage device according to a seventh embodiment of the present invention.

FIG. 25 shows a main sectional view of a semiconductor storage device according to a seventh embodiment of the present invention.

The present embodiment has a first magnetic film 200 having a desired shape, a high-resistance film 201 adjacent to the first magnetic film, a conductor wiring 206, and second magnetic films 207. The conductor wiring 206 is disposed facing the first magnetic film 200 and the high-resistance film 201. The second magnetic films 207 are disposed facing side surfaces of the conductor wiring 206. The high-resistance film 201 is oxide, nitride, or oxynitride containing at least a part of the material of the first magnetic film 200. A distance between an end portion of the second magnetic film 206 and the high-resistance film 201 may be set to 20 nm or less, or they may be brought into contact. The distance between the end portion of the second magnetic film 207 and the first magnetic film 200 may be determined in a self-matching manner.

Eighth Embodiment

Figure 26:
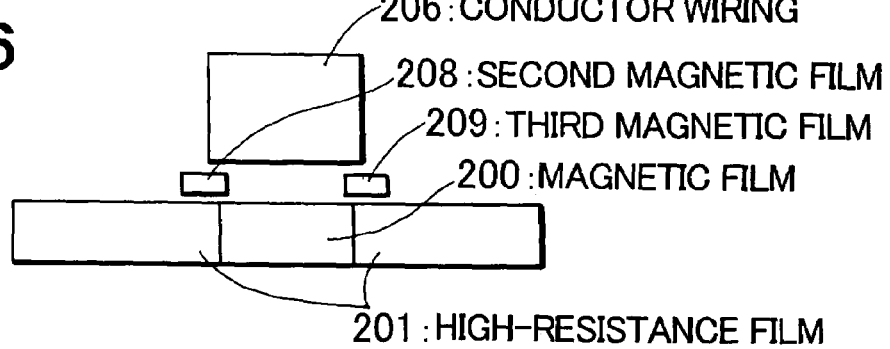
FIG. 26 is a main part sectional view of the semiconductor storage device according to an eighth embodiment of the present invention.

FIG. 26 shows a main sectional view of a semiconductor storage device according to an eighth embodiment of the present invention.

The present embodiment has a first magnetic film 200 having a desired shape, a high-resistance film 201 adjacent to the first magnetic film, a conductor wiring 206, a second magnetic film 208, and a third magnetic film 209. The conductor wiring 206 is disposed facing the first magnetic film 200 and the high-resistance film 201. The second magnetic film 208 and the third magnetic film 209 are parallel to each other, and are disposed between the first magnetic film 200 and the conductor wiring 206. A center of the first magnetic film 200 is positioned between the second magnetic film 208 and the third magnetic film 209. The high-resistance film 201 is oxide, nitride, or oxynitride containing at least a part of the material of the first magnetic film 200.

EXAMPLES

First Example

Figure 8:
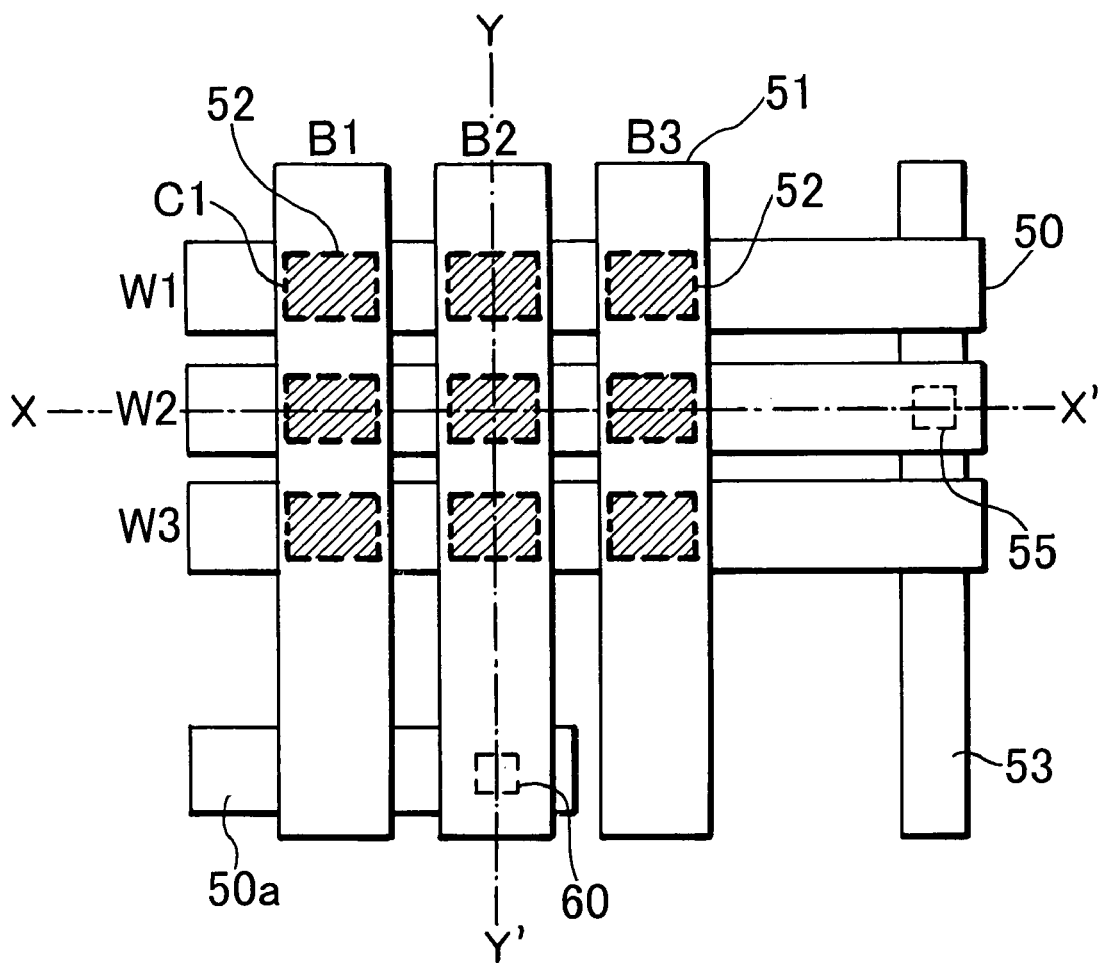
FIG. 8 is a schematic plan view of the semiconductor storage device according to a first example of the present invention.
Figure 9A:
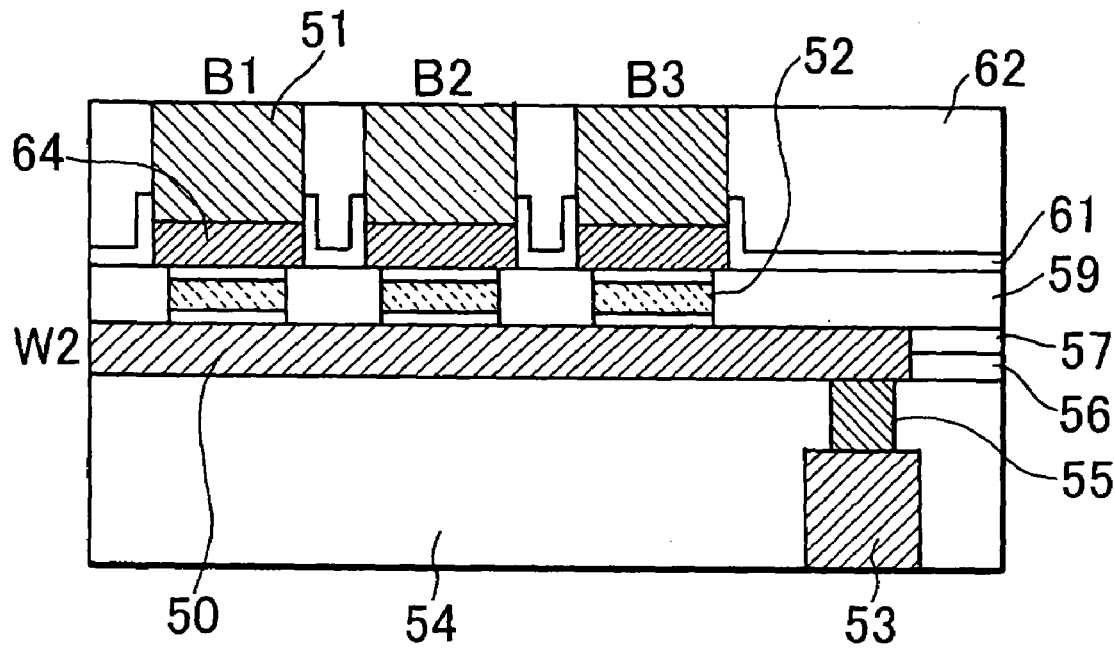
FIG. 9A is a sectional view along line X-X' of FIG. 8.
Figure 9B:
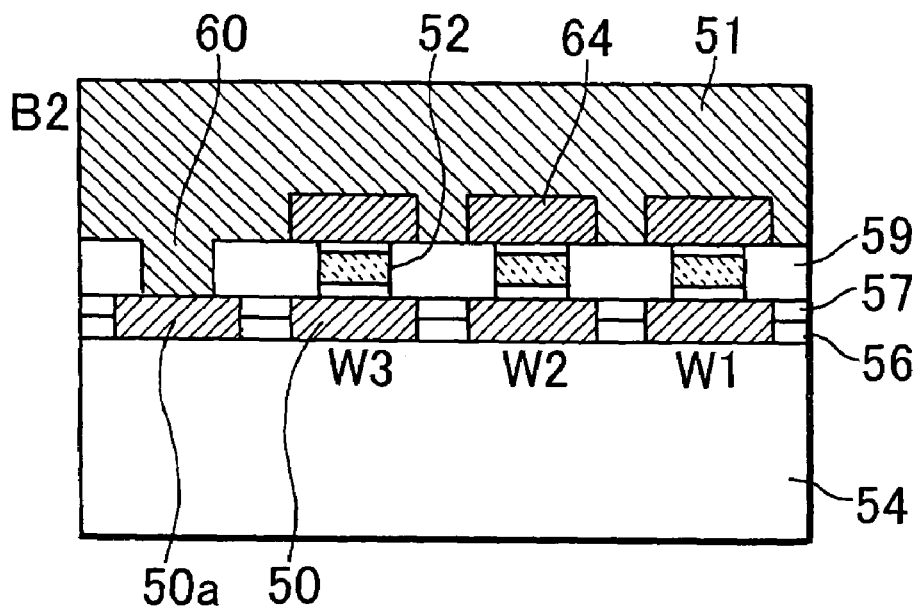
FIG. 9B is a sectional view along line Y-Y' of FIG. 8.

A first example of the present invention will be described with reference to FIGS. 8, 9A, 9B, 10A to 10F, and 11. FIG. 8 is a plan view of a semiconductor storage device according to a first example of the present invention, FIG. 9A is a sectional view along line X-X' of FIG. 8, and FIG. 9B is a sectional view along line Y-Y' of FIG. 8. FIGS. 10A to 10F are production step sectional views of the semiconductor storage device according to the present example.

Figure 11:
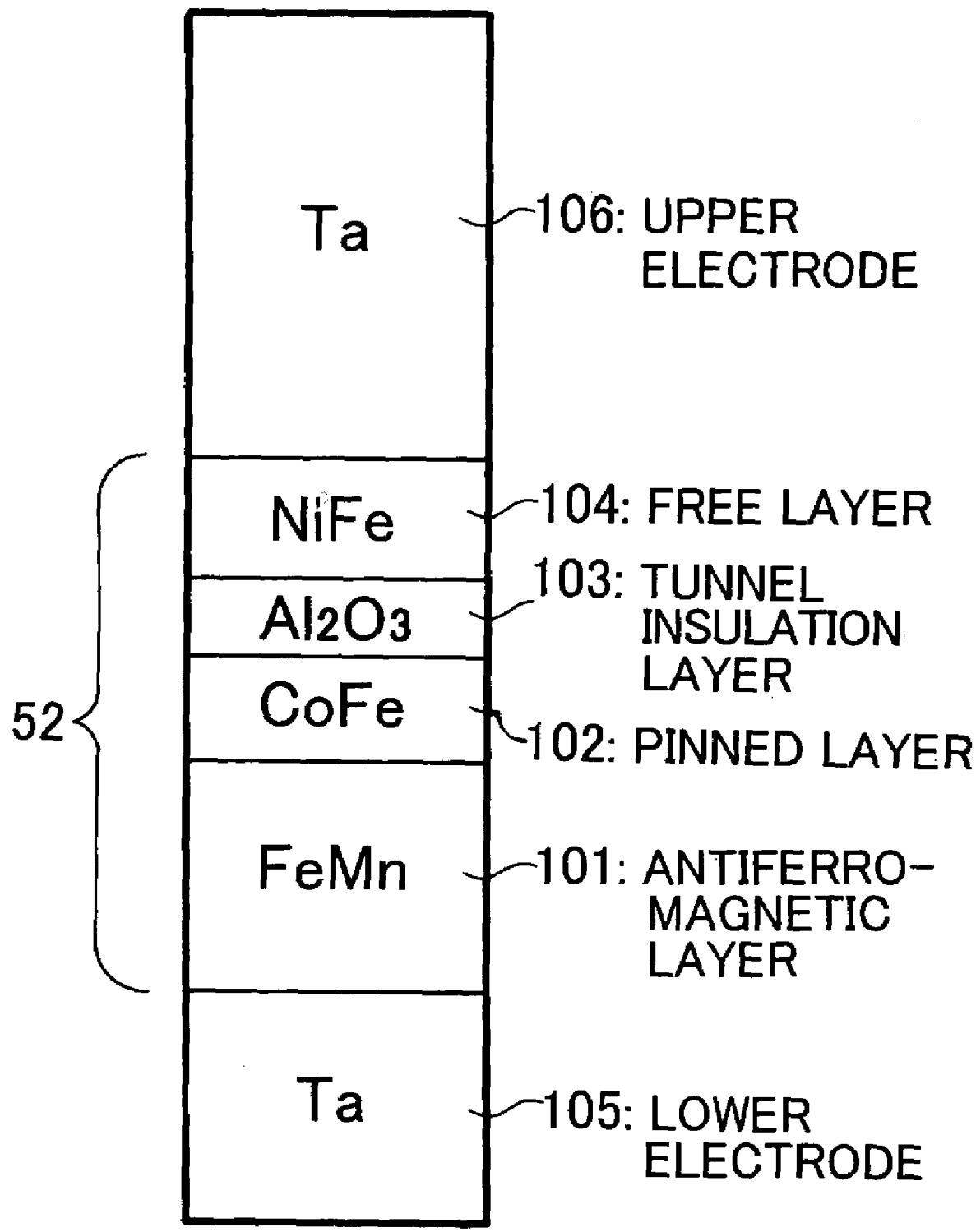
FIG. 11 is a sectional view showing a TMR of the semiconductor storage device according to the first example of the present invention.

The semiconductor storage device of the present example has word lines (W1, W2, W3) 50, bit lines (B1, B2, B3) 51, and TMRs (C1) 52 which are magnetic elements. The TMR 52 is disposed corresponding to an intersecting portion between the word line 50 and the bit line 51 in the plan view of FIG. 8, and is formed on the word line 50. The bit line 51 is electrically connected to an upper magnetic layer of the TMR 52, and the word line 50 is electrically connected to a lower magnetic layer of the TMR 52. FIG. 11 shows a sectional view of the TMR (C1). As shown in FIG. 11, an antiferromagnetic layer (10 nm thick) 101 formed of FeMn, a pinned layer (2.4 nm thick) 102 formed of CoFe, a tunnel insulation layer 103 formed of $Al_2O_3$, and a free layer (5 nm thick) 104 formed of NiFe are stacked to form the TMR 52. The antiferromagnetic layer and the free layer are connected to a lower electrode 105 and an upper electrode 106 formed of Ta, respectively, so that a voltage can be applied between these layers. Each of the lower electrode 105 and the upper electrode 106 may constitute a part of the word line 50 or the bit line 51, respectively. Magnetization of the pinned layer is fixed in a predetermined direction by the antiferromagnetic layer. The free layer is formed in such a manner as to be easily magnetized in a predetermined certain direction, and the direction of the magnetization can be changed by application of a magnetic field from the outside. In a horizontal direction (direction parallel to the surface of the film), a direction in which the layer is easy to magnetize is referred to as an easy axis, and a direction which is vertical to the easy axis and in which the layer is not easily magnetized is referred to as a difficult axis. When the voltage is applied between the free layer and the pinned layer, the current flows through the tunnel insulation layer, and a resistance value of the TMR changes according to a relation between the magnetization directions of the free layer and the pinned layer. That is, when the magnetization directions are the same, the resistance drops. When the magnetization directions are opposite, the resistance increases.

Next, a method of producing the semiconductor storage device will be described. An electric circuit constituted of an element such as a transistor and a wiring 53 is formed on a silicon substrate (not shown), and a silicon oxide film 54 is formed by a plasma CVD method, and flattened by CMP. It is to be noted that FIGS. 9A and 9B show a structure above the wiring 53 with which a silicon oxide film 54 formed on the silicon substrate is covered. The wiring 53 connected to the element or the wiring formed on the semiconductor substrate is connected to the TMR formed above the wiring. To achieve electric connection of the wiring 53 to the magnetic element, a connection hole for exposing the surface of the wiring 53 is formed in the silicon oxide film 54 by photolithography and dry-etching techniques, tungsten (W) is deposited on the surface of the silicon oxide film 54 and inside the connection hole, and W other than the connection hole is removed by the CMP again to form a plug 55. Thereafter, a silicon nitride film 56 and a silicon oxide film 57 are formed in order on the whole surface of the silicon oxide film 54, the silicon oxide film 57 of a portion in which the wiring (word line 50) is disposed is removed by the photolithography and dry-etching techniques [FIG. 10A], further the silicon nitride film 56 exposed at the wiring laying portion is also removed by the dry etching, and the surface of the plug 55 is exposed. After ashing/removing a resist, a Ti layer (10 nm thick), a TiN layer (30 nm thick), and an AlSiCu layer (200 nm thick) are continuously formed into films by a sputtering process to form a wiring material layer 58 [FIG. 10B]. The wiring material layer other than the wiring laying portion is removed by the CMP, and AlSiCu is left in a thickness of 50 nm in the wiring laying portion to form the word line 50 and a leader line 50a (see FIG. 8) of the same layer as that of the word line.

Next, a Ta layer (10 nm thick), an FeMn layer (10 nm thick), a CoFe layer (2.4 nm thick), and an Al layer (1.5 nm thick) are continuously formed into films by the sputtering process, and thereafter stored in an oxygen atmosphere to oxidize the Al layer. Thereafter, an NiFe layer (5 nm thick), a Ta layer (10 nm thick), and an Al layer (20 nm thick) constituting a mask 64 are continuously formed by the sputtering process. The resist is left in a rectangular shape having a size of 0.5 μm×0.8 μm corresponding to the TMR 52. Thereafter, the Al layer and the Ta layer are worked by the dry-etching technique [FIG. 10C]. After ashing/removing the resist, the whole surface is treated with oxygen plasma, and the NiFe layer, CoFe layer, FeMn layer, and Ta layer of the portion which is not covered with the Al layer are oxidized. Accordingly, the TMR 52 separated and isolated by a magnetic material oxide film 59 which is an insulated region (high-resistance region) is formed [FIG. 10D].

Next, the magnetic material oxide film 59 of a region constituting a connection portion to the leader line 50a of the lower layer is removed by the photolithography technique and an ion milling technique, and a via-hole 60 for exposing the surface of the leader line 50a is formed [see FIG. 9B]. On the whole surface, a silicon nitride film 61 is deposited in a film thickness of 20 nm, a silicon oxide film 62 is deposited in a thickness of 400 nm, and the film is flattened by a CMP technique [FIG. 10E]. A trench having a shape corresponding to the bit line 51 is formed in the silicon oxide film 62 by the photolithography and dry-etching techniques, and the exposed silicon nitride film 61 is also removed. After ashing/removing the resist, surface oxide of the exposed portion of the mask 64 and a Ta film which is the upper electrode for the TMR is removed by ion milling, and thereafter a Ti layer (10 nm thick), a TiN layer (30 nm thick), and an AlSiCu layer (600 nm thick) are continuously formed into films by the sputtering process. Next, the wiring material other than the wiring laying portion is removed by the CMP, and the bit line 51 is formed [FIG. 10F]. Thereafter, a silicon oxynitride film is formed and a bonding pad portion is opened in the film, or if necessary, the above-described steps can be repeated to form the wiring or the TMR (magnetic element) to be multi-layered.

After oxidizing the periphery of the TMR in order to reduce a leakage current between adjacent cells, the magnetic material oxide film 59 may be subsequently partially removed with respect to a thickness direction. In this case, since the removed material is oxide, short-circuit does not occur even when the removed material sticks again. In order to enhance the insulation between the adjacent wirings, after forming the bit line, the silicon oxide film 62 and the silicon nitride film 61 are removed, and a part or all of the magnetic material oxide film 59 which is not covered with the bit line may be removed. In this case, since oxide is removed, any short-circuit does not occur even if the material sticks again. After the removing, the silicon oxide film is deposited, and the silicon oxide film having high insulation is charged between the TMRs. In order to facilitate the oxidation around the TMR, after working the Al layer and the Ta layer, a material containing oxygen atoms is ion-implanted, or the layers may be stored in a high-temperature atmosphere of oxygen ions, oxygen radicals, and ozone. Silicon, zirconium, cerium, or hafnium which is easy to oxidize may be ion-implanted before oxidized. To reduce an influence of magnetism from the periphery, after working the Al layer and the Ta layer, the atoms are ion-implanted in such a manner that the layer does not have ferromagnetic characteristic after insulated, the material containing the atoms is formed into the film to diffuse the atoms at high temperature, or ions are applied to push in so that the atoms may be introduced into the film. As the wiring material, AlCu, Cu or the like may be used. To prevent the lower wiring from being easily oxidized, TiN may remain on the lower wiring upper surface, or Al may constitute a surface layer. After forming the lower wiring, an about 3 nm thin insulation film of $SiO_2$ or $Al_2O_3$ may be formed on the whole surface. The current flows through the TMR portion in tunnel phenomenon, and therefore any problem does not occur even if the thin insulation film is formed.

A nonlinear characteristic can be imparted to the magnetic element, when a stacked structure of layers having two or more layers of different dielectric constant is held between the elements. The magnetic material oxide film may be removed even from a portion which is not connected to the lower wiring. To enhance the insulation between the upper and lower wirings of the TMR, conductive materials such as amorphous silicon and Zr may be deposited on the whole surface together with the magnetic element material. These materials pass the current in the TMR portion, and constitute insulators in the oxidized portion. When the mask for the oxidation around the TMR is formed of the conductive material, materials that are not easily oxidized, such as TiN, Al, Pt, Ir, and materials having conductivity even when oxidized, such as Ru, In are preferable. After the oxidation, the mask material may be removed. Moreover, the mask material may be an insulator. In this case, the material is removed by the dry-etching technique after the periphery oxidation process. The TMR may have a structure in which an antiferromagnetic layer is above a tunnel film, or in which any antiferromagnetic layer is not disposed. The magnetic material preferably comprises atoms constituting insulators when oxidized, and preferable antiferromagnetic materials are FeMn, NiMn and the like. A magnetoresistive element may be an element referred to as AMR using a magnetoresistive effect of the magnetic material, or an element referred to as GMR in which a thin conductor film is held between a pair of magnetic materials. A vertical relation between the bit line and the word line is changeable.

Next, a method of using the semiconductor storage device will be described. This semiconductor storage device constitutes a nonvolatile memory in which the TMR is used as a storage element. First, the writing of the data will be described. When the current is passed through the word line W1, and a current having a direction corresponding to the data is passed through the bit line B1, a synthetic magnetic field is applied to the TMR positioned corresponding to the intersection, and the free layer is magnetized in accordance with the direction of the current of the bit line. Even after the current is stopped, or a power supply is cut, the free layer, which is formed of the ferromagnetic material, holds its magnetized direction, and operates as a nonvolatile memory.

Next, the reading of the data will be described. The bit line B1 is set to be floating, and is connected to an integration circuit. About 0.5 V is applied to the word line W1. Other wirings are grounded. Since the resistance value of the TMR positioned corresponding to the intersection between W1 and B1 changes with the direction of the magnetization, the amount of the current flowing into the integration circuit differs. After integration for a certain time, the direction of the magnetization is distinguished by comparison with a reference value, and the written data can be read.

In this embodiment, since the current of the upper wiring also flows through the Ta layer of the upper electrode of the TMR, the free layer of the TMR which is the magnetic element can be disposed in the vicinity of the writing current. In the present example, both the layers are closely attached to each other.

Second Example

Figure 12:
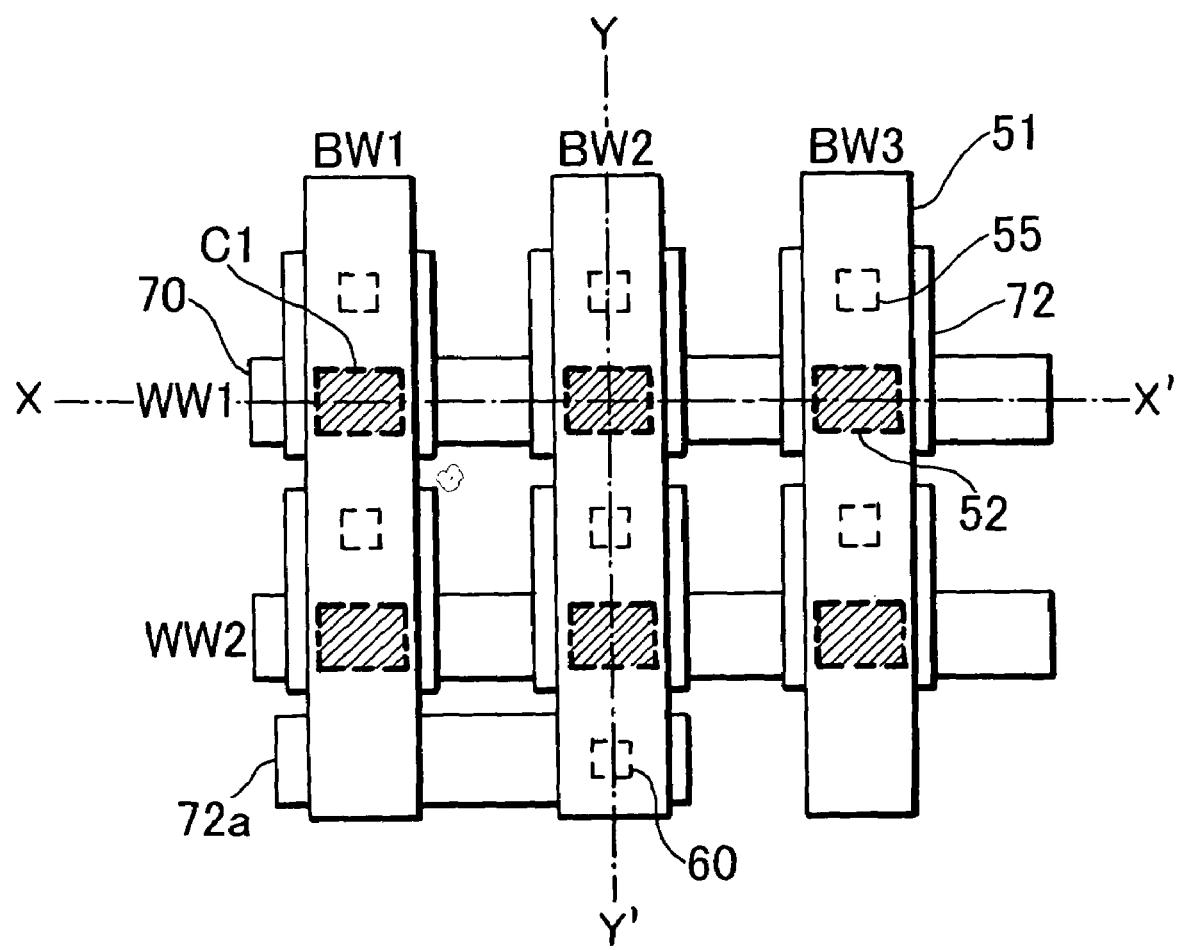
FIG. 12 is a schematic plan view of the semiconductor storage device according to a second example of the present invention.
Figure 13A:
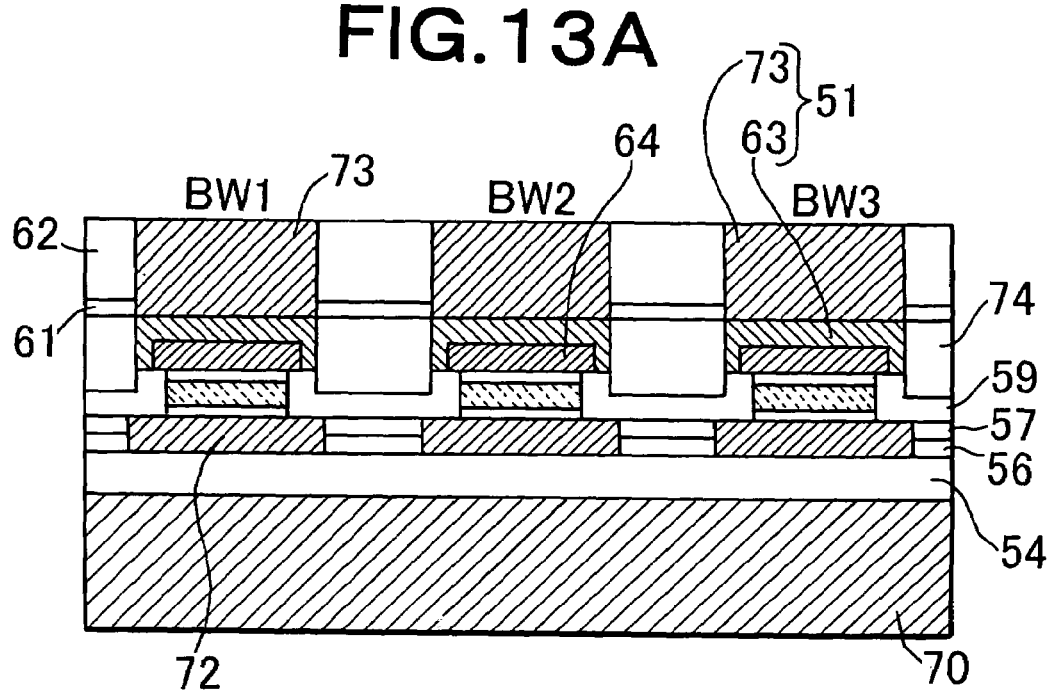
FIG. 13A is a sectional view along line X-X' of FIG. 12.
Figure 13B:
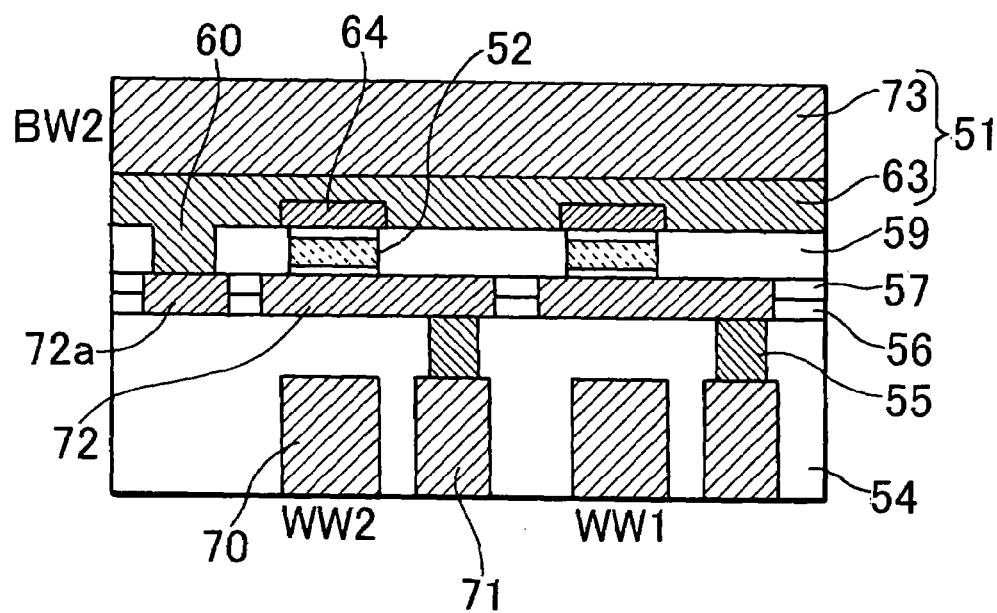
FIG. 13B is a sectional view along line Y-Y' of FIG. 12.

Next, a second example will be described with reference to FIGS. 12, 13A, 13B, and 14A to 14F. FIG. 12 is a plan view of a semiconductor storage device according to a second example of the present invention, FIG. 13A is a sectional view along line X-X' of FIG. 12, and FIG. 13B is a sectional view along line Y-Y' of FIG. 12. FIGS. 14A to 14F are production step sectional views of the semiconductor storage device of this example.

As shown in FIG. 12, the semiconductor storage device of the present example has writing word lines (WW1, WW2) 70, a reading word line 71, a leader line 72, bit lines (BW1, BW2, BW3) 51, and TMRs 52. The TMR 52 is formed in a position corresponding to an intersecting portion between the writing word line 70 and the bit line 51. The bit line 51 is electrically connected to an upper magnetic layer of the TMR 52, and the reading word line 71 is electrically connected to the leader line 72, and a lower magnetic layer of the TMR 52. Although not shown, the reading word line 71 of each cell is connected to a drain of an MOS transistor formed on the substrate. A source of the transistor is grounded, and a gate thereof is connected to a control line which turns on/off the transistor. A structure of the TMR 52 is the same as that of FIG. 11.

Next, a method of producing the semiconductor storage device will be described. It is to be noted that FIGS. 13A and 13B show a structure above the layer of the wiring of a substrate uppermost layer including the writing word line 70 and the reading word line 71. An element such as a transistor is formed on a silicon substrate (not shown), the writing word line 70 and the reading word line 71 are formed, and thereafter a silicon oxide film 54 is formed by a plasma CVD process, and flattened by the CMP. A connection hole to the wiring is formed in the silicon oxide film 54 by photolithography and dry-etching techniques, tungsten (W) is deposited on the whole surface of the silicon oxide film 54 including the inside of the connection hole, and W other than the connection hole is removed by the CMP again to form plugs 55. Thereafter, a silicon nitride film 56 and a silicon oxide film 57 are formed in order on the whole surface, the silicon oxide film 57 of a portion in which the wiring is disposed is removed by the photolithography and dry-etching techniques, further the silicon nitride film 56 exposed at the wiring laying portion is also removed by the dry etching, and the surface of the plug 55 is exposed. After ashing/removing a resist, a Ti layer (10 nm thick), a TiN layer (30 nm thick), and an AlSiCu layer (200 nm thick) are continuously formed into films by a sputtering process to form a wiring material layer 58 [FIG. 14A].

Next, the wiring material layer other than the wiring laying portion is removed by the CMP, and an AlSiCu layer is left in a thickness of 50 nm in the wiring laying portion to form leader lines 72, 72a [see FIGS. 12, 13B]. Furthermore, a Ta layer (10 nm thick), an FeMn layer (10 nm thick), a CoFe layer (2.4 nm thick), and an Al layer (1.5 nm thick) are continuously formed into films by the sputtering process, and thereafter the Al layer is oxidized by oxygen plasma. Thereafter, an NiFe layer (5 nm thick), a Ta layer (10 nm thick), and an Al layer (20 nm thick) constituting a mask 64 are continuously formed by the sputtering process. Furthermore, a resist film is formed into the shape of the TMR 52 to be formed on the Al layer by the photolithography technique. Thereafter, the Al layer and the Ta layer are worked by the dry-etching technique to form the mask 64 [FIG. 14B]. After ashing/removing the resist film, the whole surface is treated with the oxygen plasma, and the NiFe layer, CoFe layer, FeMn layer, and Ta layer of the portion which is not covered with the Al layer are oxidized. Accordingly, the TMR 52 separated and isolated by a magnetic material oxide film 59 which is an insulated region is formed. Next, the magnetic material oxide film 59 of a portion constituting a connection portion to the leader line 72a is removed using the photolithography technique and an ion milling technique, and the surface of the leader line 72a is exposed to form a via-hole 60 [see FIG. 13B].

Figure 14A:
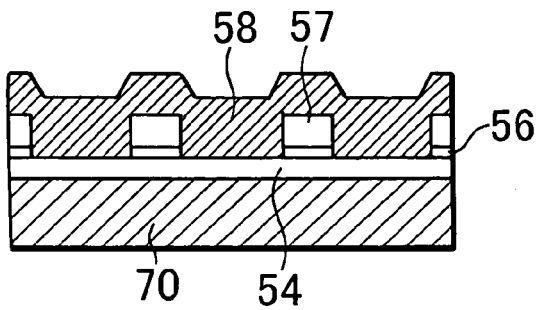
FIG. 14A is a sectional view of a production step of the semiconductor storage device according to the second example of the present invention.
Figure 14B:
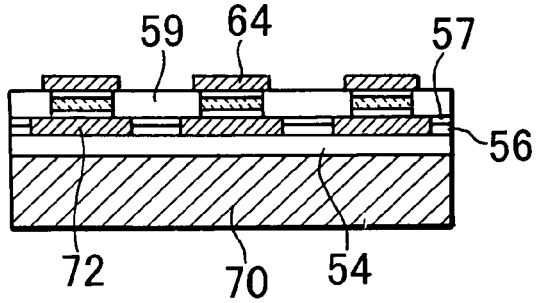
FIG. 14B is a sectional view of the production step of the semiconductor storage device according to the second example of the present invention.
Figure 14C:
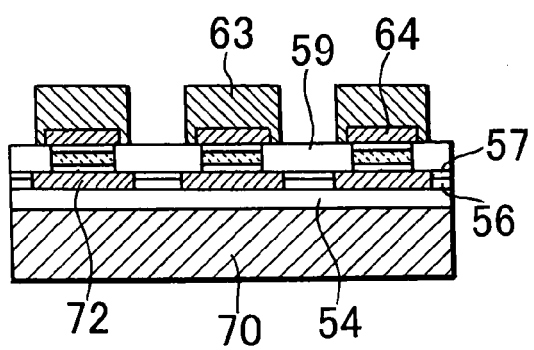
FIG. 14C is a sectional view of the production step of the semiconductor storage device according to the second example of the present invention.
Figure 14D:
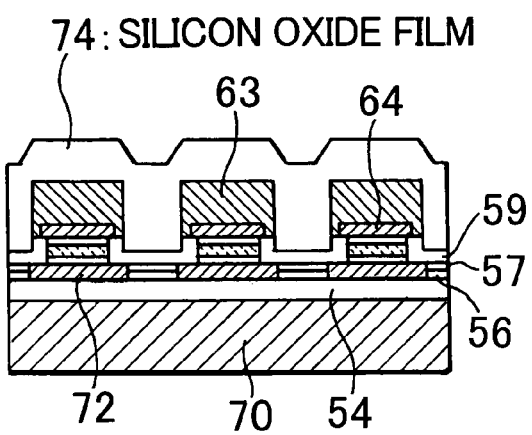
FIG. 14D is a sectional view of the production step of the semiconductor storage device according to the second example of the present invention.
Figure 14E:
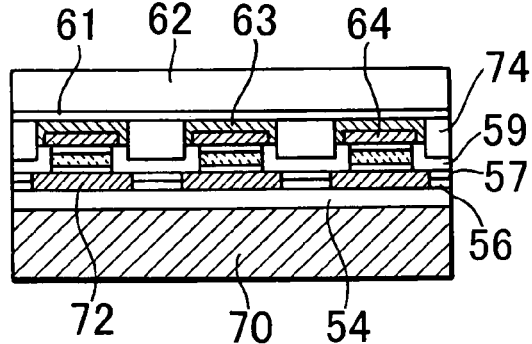
FIG. 14E is a sectional view of the production step of the semiconductor storage device according to the second example of the present invention.
Figure 14F:
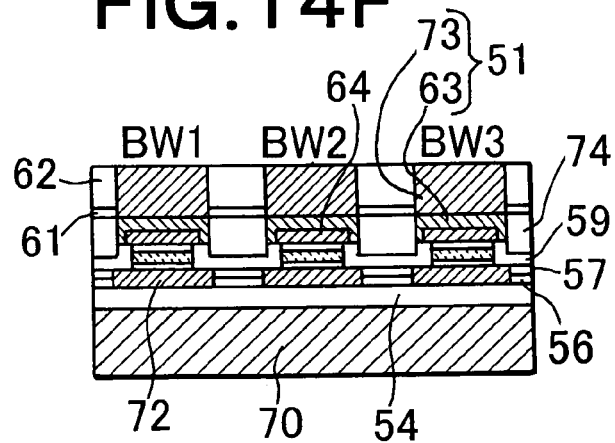
FIG. 14F is a sectional view of the production step of the semiconductor storage device according to the second example of the present invention.
Figure 15:
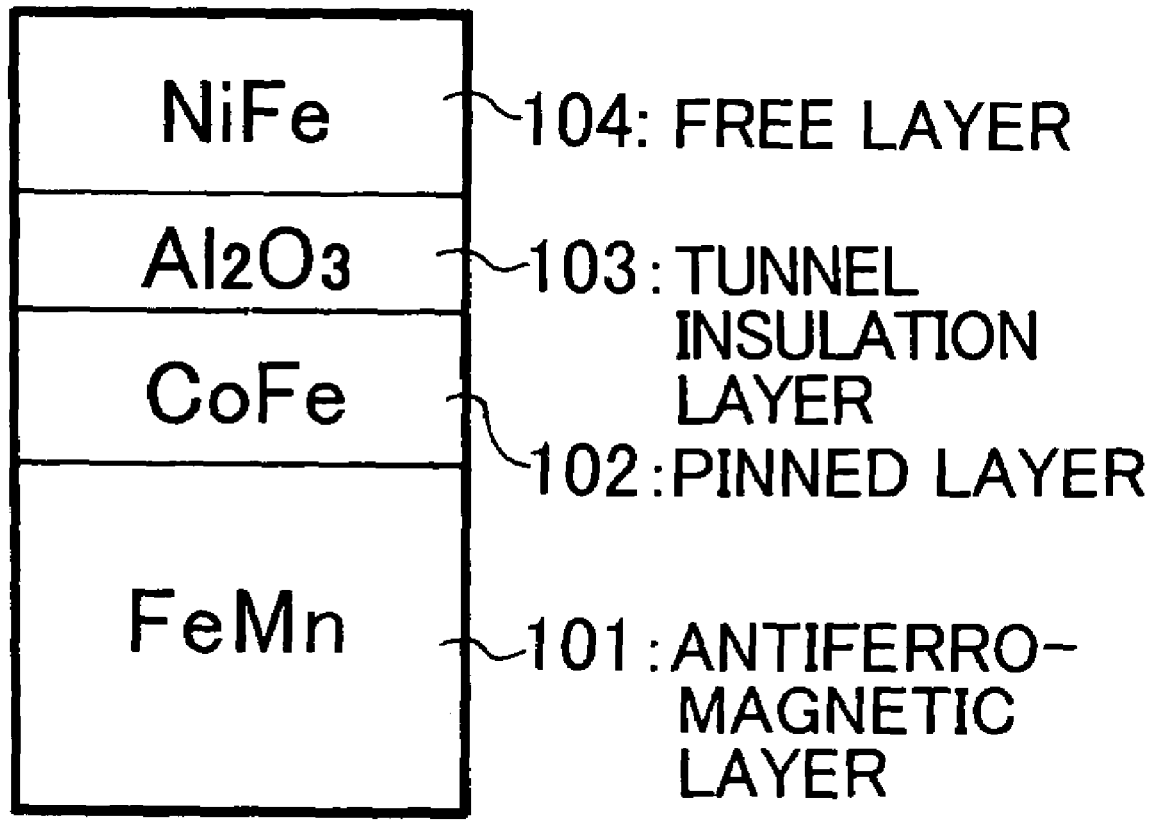
FIG. 15 is a sectional view showing the TMR of a conventional semiconductor storage device.
Figure 16:
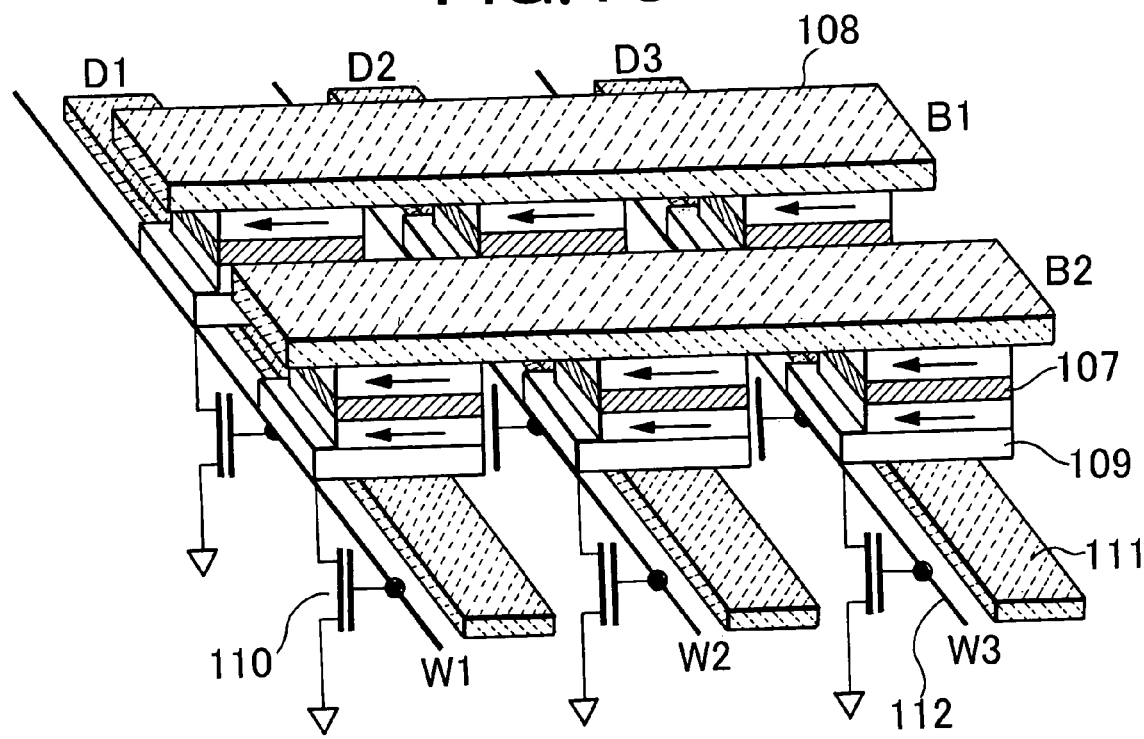
FIG. 16 is a schematic perspective view showing the conventional semiconductor storage device.
Figure 19:
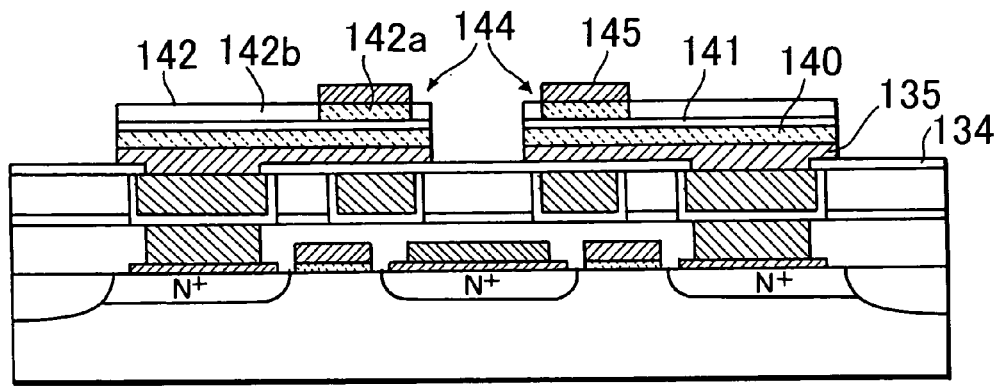
FIG. 19 is a production step sectional view of the conventional semiconductor storage device.
Figure 20:
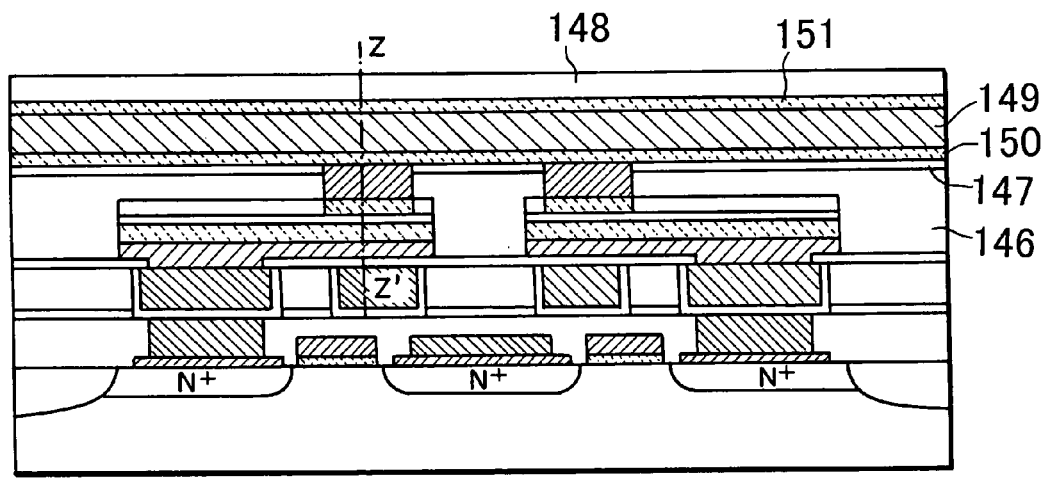
FIG. 20 is a production step sectional view of the conventional semiconductor storage device.
Figure 21:
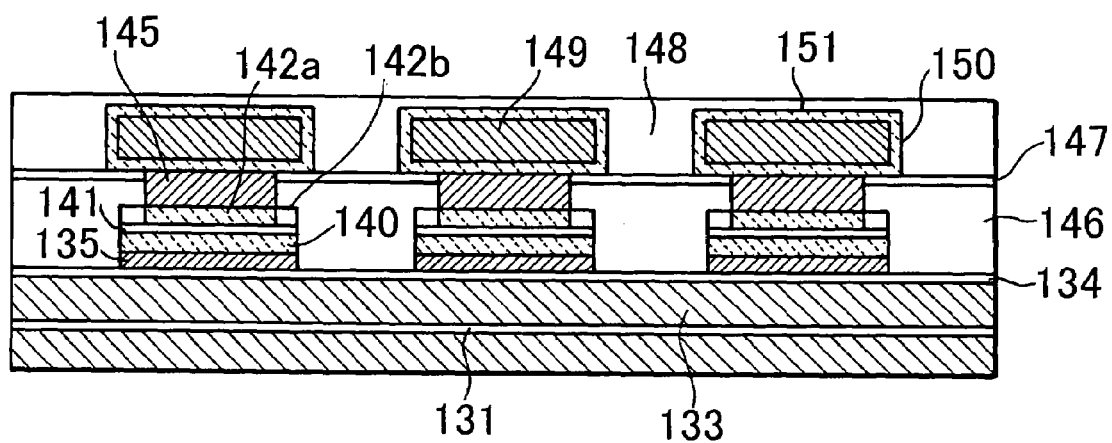
FIG. 21 is a sectional view along line Z-Z' of FIG. 20.

After ashing/removing the resist film, surface oxide of the exposed portion of the mask 64 and a Ta film is removed by the ion milling process, and thereafter a TiN layer (20 nm thick) and an AlSiCu layer (50 nm thick) are formed in order, and worked into the shape of the bit line 51 by the photolithography and dry-etching techniques, and a first wiring layer 63 is formed [FIG. 14C]. Furthermore, a part of an oxidized portion of each of an NiFe layer, a CoFe layer, and an FeMn layer of the magnetic material oxide film 59 is removed by an etching gas containing argon and chlorine as main components. In this case, the removed material is oxide, and therefore even when over-etching is performed, and even when the material sticks again, the tunnel film in the TMR does not cause any short-circuit on the side walls. A silicon oxide film 74 is formed on the whole surface [FIG. 14D], and flattened by the CMP until the wiring appears on the surface. Thereafter, a silicon nitride film 61 is formed into a thickness of 20 nm, and a silicon oxide film 62 is formed into a thickness of 400 nm on the whole surface [FIG. 14E]. A trench having a shape corresponding to the bit line 51 is formed in the silicon oxide film 62 by the photolithography and dry-etching techniques, and the exposed silicon nitride film 61 is also removed. After ashing/removing the resist, a Ti layer (10 nm thick), a TiN layer (30 nm thick), and an AlSiCu layer (600 nm thick) are continuously formed into films by a sputtering process. When the wiring material other than the wiring laying portion is removed by the CMP, a second wiring layer 73 for the thick bit line 51 is formed. The second wiring layer 73 and the first wiring layer 63 constitute the bit line 51 [FIG. 14F]. The method described in the first example can be applied even to this example.

Next, a method of using the semiconductor storage device will be described. This semiconductor storage device constitutes a nonvolatile memory in which the TMR is used as a storage element. First, the writing of the data will be described. To perform the writing with respect to the TMR of C1, a current is passed through a writing word line WW1, and a current having a direction corresponding to the data is passed through the bit line BW1, then a synthetic magnetic field is applied to the TMR (C1) positioned corresponding to the intersection, and the free layer is magnetized in accordance with the direction of the current of the bit line. Even after the current is stopped, or a power supply is cut, the free layer, which is formed of the ferromagnetic material, holds its magnetized direction, and operates as a nonvolatile memory.

Next, the reading of the data will be described. An only MOS transistor of a cell positioned corresponding to an intersection between WW1 and BW1 is set to an on-state, a current is injected into BW1, then the resistance value of the TMR changes in accordance with the magnetized direction, and therefore an activated voltage differs. By comparison of this value with a reference voltage, the direction of the magnetization is distinguished, and written data can be read.

In this example, since the current of the upper wiring also flows through the Ta layer of the TMR upper electrode, the free layer of the TMR can be disposed in the vicinity of the writing current. Furthermore, since a part of the TMR material oxidized portion is removed, leakage current flowing between the adjacent TMRs can be reduced.

Third Example

Figure 27:
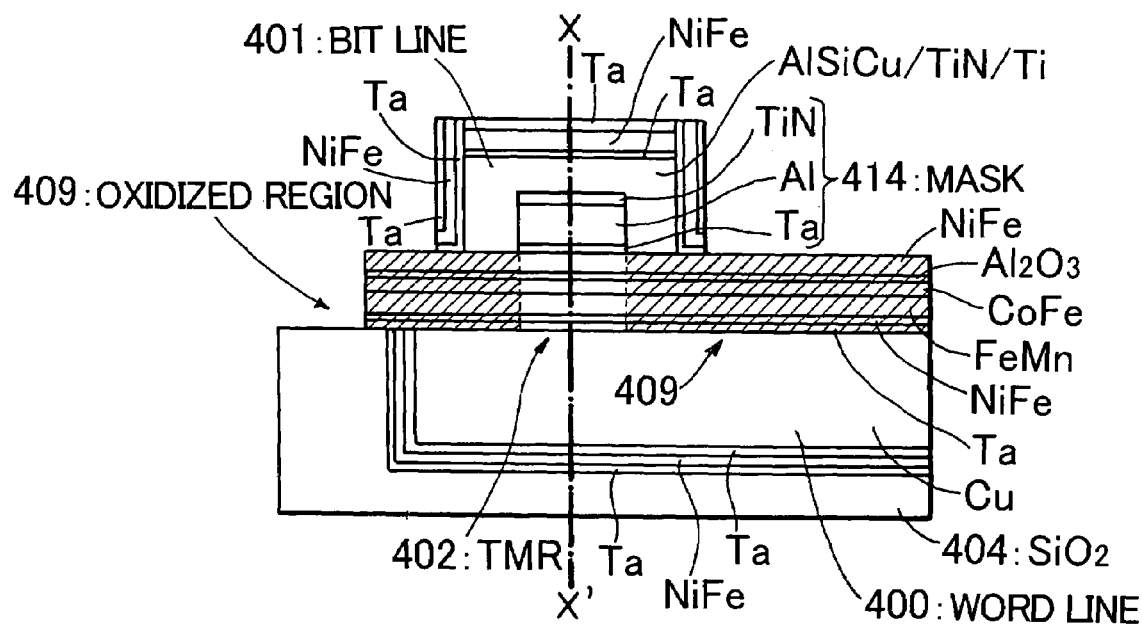
FIG. 27 is a partial sectional view of the semiconductor storage device according to a third example of the present invention.
Figure 28:
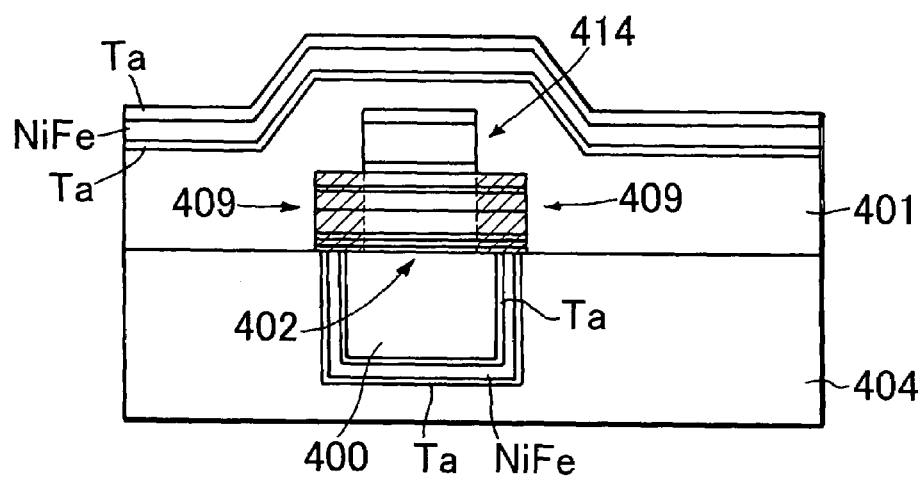
FIG. 28 is a sectional view along line X-X' of FIG. 27.

A third example of the present invention will be described with reference to FIGS. 27 and 28. FIG. 27 is a partial sectional view of the semiconductor storage device according to the third example of the present invention, and FIG. 28 is a sectional view along line X-X' of FIG. 27.

The semiconductor storage device of this example has a word line 400, a bit line 401, and a TMR 402 which is a magnetic element. The TMR 402 is disposed corresponding to an intersecting portion of the word line 400 with the bit line 401, and is formed on the word line 400. The bit line 401 is electrically connected to an upper magnetic layer of the TMR 402, and the word line 400 is electrically connected to a lower magnetic layer of the TMR 402. The TMR 402 is basically similar to that of the above-described example.

Next, a method of producing the semiconductor storage device will be described. An electric circuit constituted of an element such as a transistor, and a wiring is formed on a silicon substrate (not shown), and a silicon oxide film 404 is formed by a plasma CVD process, and flattened by CMP. It is to be noted that the figure shows a structure above the silicon oxide film 404 formed on the silicon substrate. A part of the silicon oxide film 404 is removed by photolithography and dry-etching techniques, and a trench having a depth of about 300 nm is formed for burying the wiring (word line) 400. Thereafter, a Ta layer (10 nm thick), an NiFe layer (10 nm thick), a Ta layer (5 nm thick), and a Cu layer (400 nm thick) are continuously formed into films on the whole surface by a sputtering process. Again by the CMP, Cu other than the wiring 400 is removed. Subsequently, a Ta layer (10 nm thick), an NiFe layer (2 nm thick), an FeMn layer (10 nm thick), a CoFe layer (2.4 nm thick), and an Al layer (1.5 nm thick) are continuously formed into films by the sputtering process, and thereafter stored in an oxygen atmosphere to oxidize the Al layer. Thereafter, an NiFe layer (5 nm thick), a Ta layer (10 nm thick), and an Al layer (20 nm thick) and a TiN layer (20 nm thick) constituting a mask 414 are continuously formed by the sputtering process. The resist is left in a rectangular shape having a size of 0.5 μm×0.8 μm corresponding to the TMR 402 by photolithography techniques. Thereafter, the TiN layer, Al layer, and the Ta layer (halfway) are worked by the dry-etching technique. After ashing/removing the resist, the whole surface is treated with oxygen plasma at about 250° C., and a remaining of the Ta layer, the NiFe layer, the CoFe layer, the FeMn layer, and the Ta layer of the portion which is not covered with the Al layer are oxidized. Ta diffuses in the NiFe layer with the oxidation, and mixed oxide is formed. Accordingly, the TMR 402 separated and isolated by a TMR material oxide film (oxidized region) 409 which is an insulated region (high-resistance region) is formed.

Next, although not shown, the oxidized region of a portion in which a via-hole for connection to the upper wiring is made in a subsequent step is removed by the photolithography and ion milling techniques.

Next, to form a shape broader than the word line 400 by about 0.1 μm, the NiFe layer, $Al_2O_3$ layer, CoFe layer, FeMn layer, and Ta layer are worked by the photolithography and milling techniques. Next, a Ti layer (10 nm thick), a TiN layer (30 nm thick), an AlSiCu layer (500 nm), a Ta layer (10 nm thick), an NiFe layer (8 nm thick), and a Ta layer (20 nm thick) are continuously formed into films on the whole surface by the sputtering process. Thereafter, the wiring material other than the wiring portion is removed by etching to form the bit line 401. At this time, since the magnetic oxide film is not easily worked, the working stops on the surface of the layer of the oxide of NiFe. Next, a Ta layer (10 nm thick), an NiFe layer (10 nm thick), and a Ta layer (10 nm thick) are continuously formed on the whole surface by the sputtering process. Subsequently, the whole surface is etched back, and accordingly the NiFe layer and the Ta layer are left on the side surfaces of the bit line 401.

As a material to be left on the oxidized region, silicon, zirconium, cerium, and hafnium which are easily oxidized in the same manner as in tantalum may be used.

In this example, since the wiring is surrounded with the magnetic material, the magnetic field generated by the current is efficiently given to the TMR. A tip of the magnetic material around the wiring is positioned in the vicinity of a portion above the oxidized region of the layer constituting the free layer of the TMR, and can therefore be disposed closer to the free layer as compared with a conventional example, and the writing is possible with a smaller current.

Fourth Example

Figure 29:
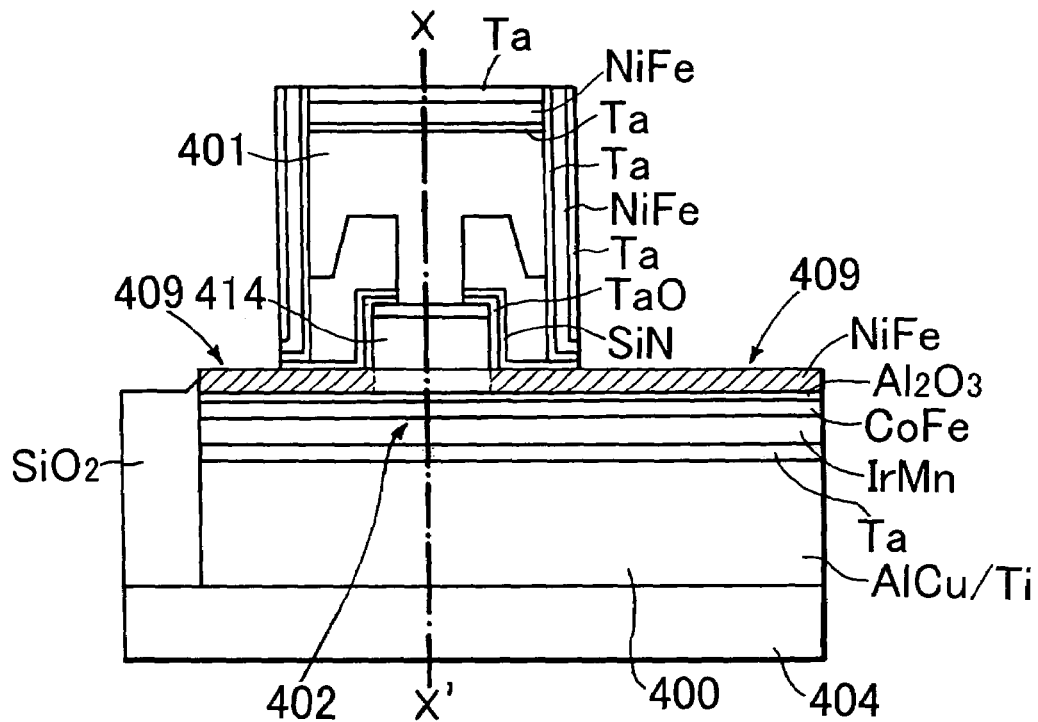
FIG. 29 is a partial sectional view of the semiconductor storage device according to a fourth example of the present invention.
Figure 30:
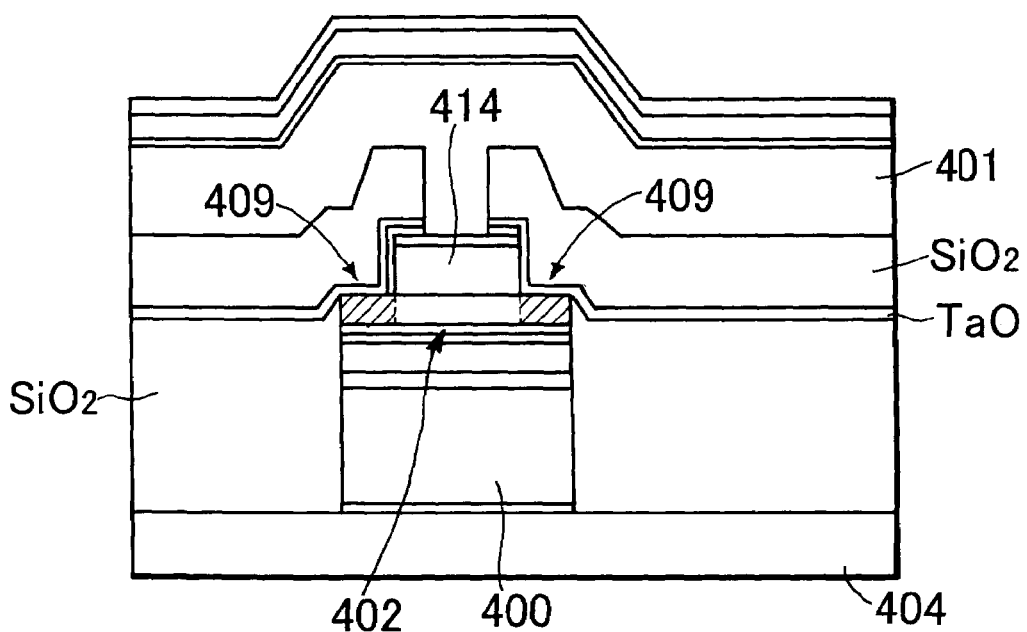
FIG. 30 is a sectional view along line X-X' of FIG. 29.

A fourth example of the present invention will be described with reference to FIGS. 29 and 30. FIG. 29 is a partial sectional view of a semiconductor storage device according to the fourth example of the present invention, and FIG. 30 is a sectional view along line X-X' of FIG. 29.

The semiconductor storage device of this example has a word line 400, a bit line 401, and a TMR 402 which is a magnetic element. The TMR 402 is disposed corresponding to an intersecting portion of the word line 400 with the bit line 401, and is formed on the word line 400. The bit line 401 is electrically connected to an upper magnetic layer of the TMR 402, and the word line 400 is electrically connected to a lower magnetic layer of the TMR 402. The TMR 402 is basically similar to that of the above-described example.

Next, a method of producing the semiconductor storage device will be described. An electric circuit constituted of an element such as a transistor, and a wiring is formed on a silicon substrate (not shown), and a silicon oxide film 404 is formed by a plasma CVD process, and flattened by CMP. It is to be noted that the figure shows a structure above the silicon oxide film 404 formed on the silicon substrate. On the silicon oxide film 404, a Ti layer (10 nm thick), an AlCu layer (300 nm thick), a Ta layer (10 nm thick), an IrMn layer (10 nm thick), a CoFe layer (2.4 nm thick), and an Al layer (1.5 nm thick) are continuously formed into films by the sputtering process, and thereafter stored in an oxygen atmosphere to oxidize the Al layer. Thereafter, an NiFe layer (5 nm thick), and a Ta layer (10 nm thick) are continuously formed by the sputtering process. By photolithography and dry-etching techniques, the Ta layer, NiFe layer, $Al_2O_3$ layer, CoFe layer, IrMn layer, Ta layer, AlCu layer, and Ti layer are worked into the shape of the word line 400. After a silicon oxide film ($SiO_2$) is formed into a film on the whole surface, and flattened by CMP, the surface of a linear structure worked into a shape of the wiring (word line) 400 is exposed by etching-back. At this time, even when over-etching is performed, side walls formed of the silicon oxide film are formed on the side surfaces of the linear structure (see FIG. 30).

An Al layer (20 nm thick) and a TiN layer (20 nm thick) constituting a mask 414 are continuously formed on the whole surface by the sputtering process. A resist is left in a rectangular shape having a size of 0.5 μm×0.8 μm and corresponding to the TMR 402. Thereafter, the TiN layer, Al layer, and Ta layer are worked by the dry-etching technique. After ashing/removing the resist, a Ta layer (3 nm thick) is formed on the whole surface, the whole surface is treated with oxygen plasma at about 250° C., and the Ta layer and NiFe layer of a portion which is not covered with the Al layer are oxidized. Ta diffuses in the NiFe layer with the oxidation, and mixed oxide is formed. Accordingly, the TMR 402 separated and isolated by a TMR material oxide film (oxidized region) 409 which is an insulated region (high-resistance region) is formed.

Next, although not shown, the oxidized region of a portion in which a via-hole for connection to the upper wiring is made in a subsequent step is removed by the photolithography and ion milling techniques.

Next, an SiN layer (20 nm thick), and an SiO$_2$ layer (300 nm thick) are formed in order by a plasma CVD process. The SiO$_2$ layer, SiN layer, and TaO layer above the TMR are removed to form a via-hole, and further on the whole surface, a Ti layer (10 nm thick), a TiN layer (30 nm thick), an AlSiCu layer (500 nm), a Ta layer (10 nm thick), an NiFe layer (8 nm thick), and a Ta layer (20 nm thick) are continuously formed into films by a sputtering process. Thereafter, the wiring material other than a wiring portion is removed by the etching to form a bit line 401. At this time, working conditions are changed in such a manner as to increase an etching selection ratio with respect to SiN during the etching of the SiO$_2$ layer, and the working is ended in the SiN layer. Next, a Ta layer (10 nm thick), an NiFe layer (10 nm thick), and a Ta layer (10 nm thick) are continuously formed on the whole surface by a sputtering process. Subsequently, the whole surface is etched back, and accordingly the NiFe layer and the Ta layer are left on the side surfaces of the bit line 401.

As a material formed into a film on an oxidized region, silicon, zirconium, cerium, and hafnium which are easily oxidized in the same manner as in tantalum may be used.

In this example, the thick insulation film is disposed between the wiring and the TMR, but the tip of the magnetic layer formed on the side surface of the wiring can be brought sufficiently close to the oxidized region, and therefore the writing is possible with a smaller current. The SiN layer which is an insulation film can be held between the tip of the magnetic layer and the oxidized region, and therefore insulation of the upper/lower wiring can be secured, even if the resistance of the oxidized region is low.

Fifth Example

Figure 31:
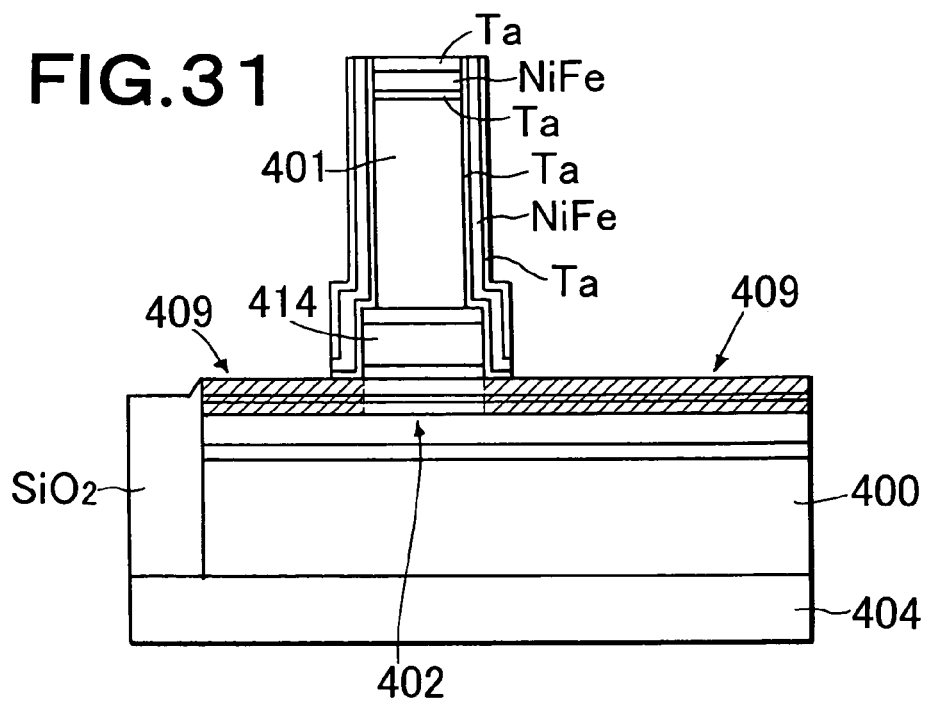
FIG. 31 is a partial sectional view of the semiconductor storage device according to a fifth example of the present invention.

A fifth example of the present invention will be described with reference to FIG. 31. FIG. 31 is a partial sectional view of a semiconductor storage device of the fifth example of the present invention.

The semiconductor storage device of this example has a word line 400, a bit line 401, and a TMR 402 which is a magnetic element. The TMR 402 is disposed corresponding to an intersecting portion of the word line 400 with the bit line 401, and is formed on the word line 400. The bit line 401 is electrically connected to an upper magnetic layer of the TMR 402, and the word line 400 is electrically connected to a lower magnetic layer of the TMR 402. The TMR 402 is basically similar to that of the above-described example.

Next, a method of producing the semiconductor storage device will be described. An electric circuit constituted of an element such as a transistor, and a wiring is formed on a silicon substrate (not shown), and a silicon oxide film 404 is formed by a plasma CVD process, and flattened by CMP. It is to be noted that the figure shows a structure above the silicon oxide film 404 formed on the silicon substrate. On the silicon oxide film 404, a Ti layer (10 nm thick), an AlCu layer (300 nm thick), a Ta layer (10 nm thick), an IrMn layer (10 nm thick), a CoFe layer (2.4 nm thick), and an Al layer (1.5 nm thick) are continuously formed into films by the sputtering process, and thereafter stored in an oxygen atmosphere to oxidize the Al layer. Thereafter, an NiFe layer (5 nm thick) and a Ta layer (10 nm thick) are continuously formed by the sputtering process. By photolithography and dry-etching techniques, the Ta layer, NiFe layer, Al$_2$O$_3$ layer, CoFe layer, IrMn layer, Ta layer, AlCu layer, and Ti layer are worked into the shape of the word line 400. After a silicon oxide film (SiO$_2$) is formed into a film on the whole surface, and flattened by CMP, the surface of the linear structure worked into the shape of the wiring (word line) 400 is exposed by etching back. At this time, even when over-etching is performed, side walls formed of the silicon oxide film are formed on the side surfaces of the linear structure (the same as FIG. 30).

An Al layer (20 nm thick) and a TiN layer (20 nm thick) constituting a mask 414 are continuously formed by the sputtering process. A resist is left in an elliptic shape corresponding to the TMR 402 and having a short diameter 0.5 μm×long diameter 0.8 μm by the photolithography technique. Thereafter, the TiN layer, Al layer, and Ta layer (halfway) are worked by the dry-etching technique. After ashing/removing the resist, the whole surface is treated with oxygen plasma at about 230° C., and a remaining Ta layer, the NiFe layer, and the CoFe layer of a portion which is not covered with the Al layer are oxidized. Ta diffuses in the NiFe layer with the oxidation, and mixed oxide is formed. Accordingly, the TMR 402 separated and isolated by a TMR material oxide film (oxidized region) 409 which is an insulated region (high-resistance region) is formed.

Next, although not shown, the oxidized region of a portion in which a via-hole for connection to the upper wiring is made in a subsequent step is removed by the photolithography and ion milling techniques.

Next, a Ta layer (10 nm thick), an AlCu layer (500 nm), a Ta layer (10 nm thick), an NiFe layer (8 nm thick), and a Ta layer (20 nm thick) are continuously formed into the films on the whole surface by a sputtering process. Thereafter, the wiring material other than the wiring portion is removed by etching to form the bit line 401. At this time, a wiring width is set to be smaller than the width of the mask for the TMR. Accordingly, since the etching is inhibited by TiN of the uppermost layer of the mask 414, the whole mask remains. Next, a Ta layer (10 nm thick), an NiFe layer (10 nm thick), and a Ta layer (10 nm thick) are continuously formed on the whole surface by the sputtering process. Subsequently, the whole surface is etched back, and the NiFe layer and the Ta layer are left on the side surfaces of the bit line 401.

In this example, since the magnetic layers can be formed on the side surfaces of the mask in the very vicinity of the TMR in a self-matching manner, a magnetic field can be efficiently applied to the magnetic element, and writing is possible with a smaller current.

Sixth Example

Figure 32:
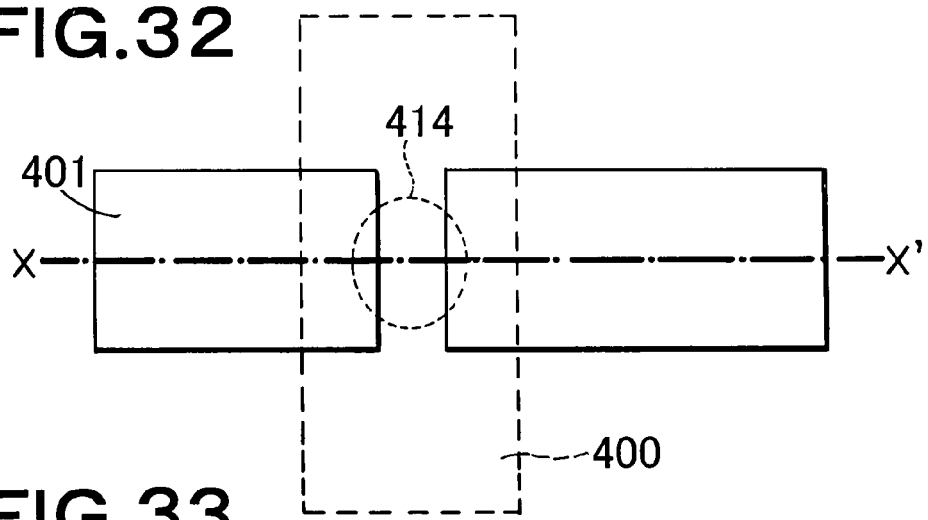
FIG. 32 is a partial plan view of the semiconductor storage device according to a sixth example of the present invention.
Figure 33:
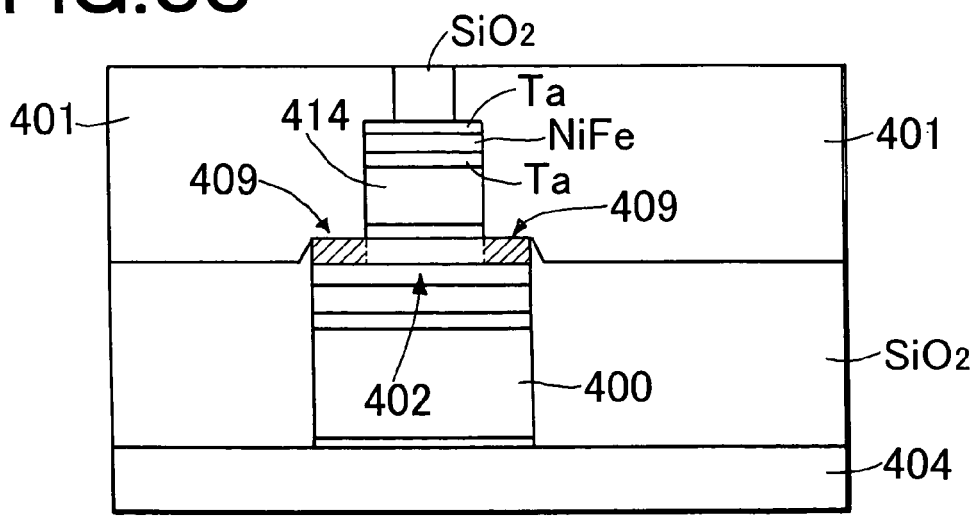
FIG. 33 is a sectional view along line X-X' of FIG. 32.

A sixth example of the present invention will be described with reference to FIGS. 32 and 33. FIG. 32 is a partial plan view of the semiconductor storage device according to the sixth example of the present invention, and FIG. 33 is a sectional view along line X-X' of FIG. 32.

The semiconductor storage device of this example has a word line 400, a bit line 401, and a TMR 402 which is a magnetic element. The TMR 402 is disposed corresponding to an intersecting portion of the word line 400 with the bit line 401, and is formed on the word line 400. The bit line 401 is electrically connected to an upper magnetic layer of the TMR 402, and the word line 400 is electrically connected to a lower magnetic layer of the TMR 402. The TMR 402 is basically similar to that of the above-described example.

Next, a method of producing the semiconductor storage device will be described. An electric circuit constituted of an element such as a transistor, and a wiring is formed on a silicon substrate (not shown), and a silicon oxide film 404 is formed by a plasma CVD process, and flattened by CMP. It is to be noted that the figure shows a structure above the silicon oxide film 404 formed on the silicon substrate. On the silicon oxide film 404, a Ti layer (10 nm thick), an AlCu layer (300 nm thick), a Ta layer (10 nm thick), a PtMn layer (10 nm thick), a CoFe layer (2.4 nm thick), and an Al layer (1.5 nm thick) are continuously formed into films by the sputtering process, and thereafter stored in an oxygen atmosphere to oxidize the Al layer. Thereafter, an NiFe layer (5 nm thick) and a Ta layer (10 nm thick) are continuously formed by the sputtering process. By photolithography and dry-etching techniques, the Ta layer, NiFe layer, $Al_2O_3$ layer, CoFe layer, PtMn layer, Ta layer, AlCu layer, and Ti layer are worked into the shape of the word line 400. After a silicon oxide film ($SiO_2$) is formed into a film on the whole surface, and flattened by CMP, the surface of the linear structure worked into the shape of the wiring (word line) 400 is exposed by etching back. At this time, even when over-etching is performed, side walls formed are formed on the side surfaces of the linear structure (see FIG. 33).

An Al layer (50 nm thick), a Ta layer (5 nm thick), an NiFe layer (5 nm thick), and a Ta layer (5 nm thick) constituting the mask 414 is continuously formed on the whole surface by the sputtering process. A resist is left in an elliptic shape corresponding to the TMR 402 and having a short diameter 0.5 µm×long diameter 0.8 µm by the photolithography technique. Thereafter, the Ta layer, NiFe layer, Ta layer, Al layer, and Ta layer are partially worked by the dry-etching technique. After ashing/removing the resist, the whole surface is treated with oxygen plasma at about 230° C., and a remaining Ta layer and the NiFe layer of a portion which is not covered with the Al layer are oxidized. Ta diffuses in the NiFe layer with the oxidation, and mixed oxide is formed. Accordingly, the TMR 402 separated and isolated by a TMR material oxide film (oxidized region) 409 which is an insulated region (high-resistance region) is formed.

Next, although not shown, the oxidized region of a portion in which a via-hole for connection to the upper wiring is made in a subsequent step is removed by the photolithography and ion milling techniques.

Figure 34:
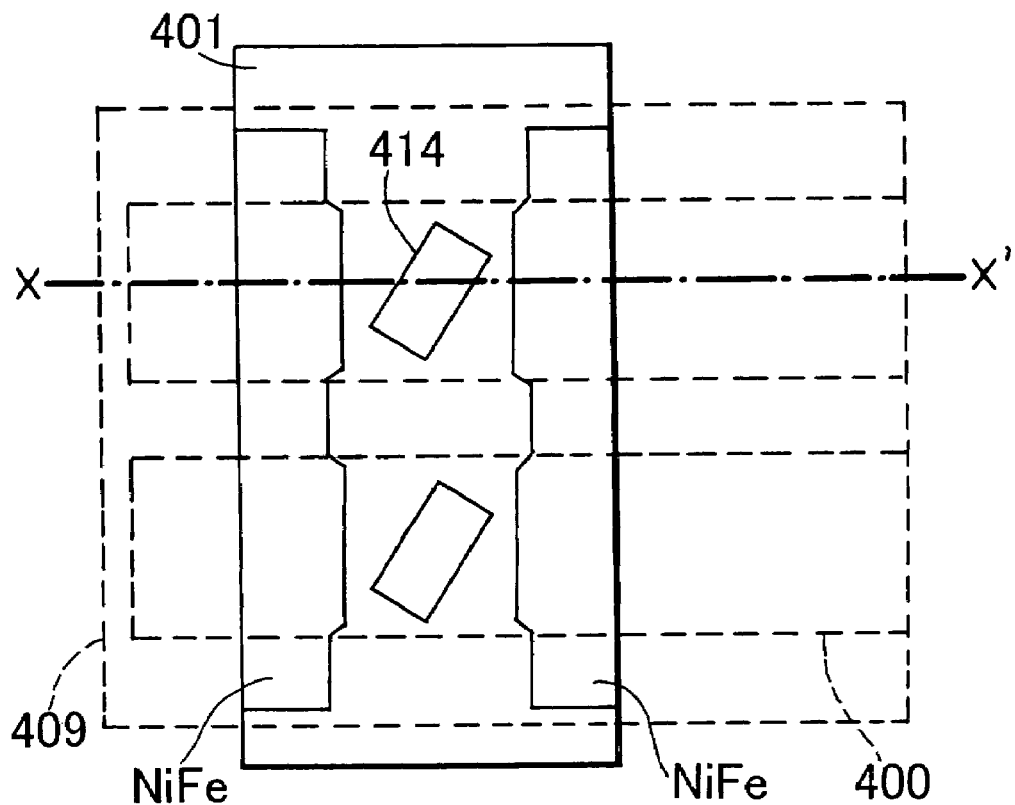
FIG. 34 is a partial plan view of the semiconductor storage device according to a seventh example of the present invention.

Next, an SiN layer (20 nm thick) and an $SiO_2$ layer (400 nm thick) are continuously formed into the films by a plasma CVD process. Thereafter, the $SiO_2$ layer and the SiN layer of a region in which the bit line 401 is to be formed are removed in a trench shape (see FIG. 32), and then a part of the mask 414 for the TMR is exposed as shown in FIG. 34. Next, a Ti layer (10 nm thick), a TiN layer (30 nm thick), and a Cu layer (500 nm thick) are continuously formed by the sputtering process. The wiring material other than the wiring portion is removed by the CMP to form the bit line 401. A current flowing through the wiring 401 passes through the Al layer of the mask 414. That is, the mask functions as a part of the wiring.

In this example, the magnetic layer having the same shape as that of the TMR can be formed on the wiring, the wiring current magnetic field can be inhibited from spreading upwards by the magnetic layer, and therefore the magnetic field can be efficiently imparted to the TMR.

Seventh Example

Figure 35:
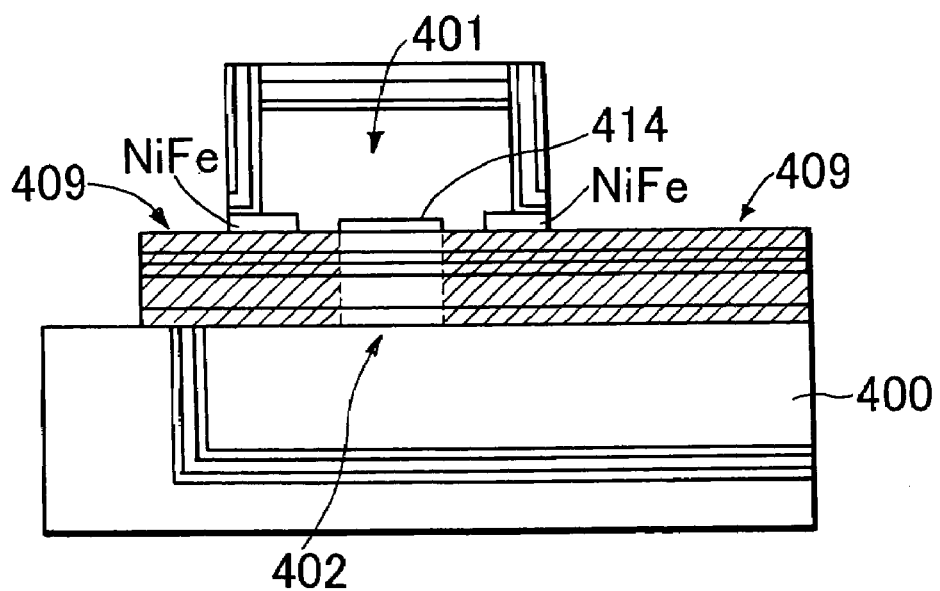
FIG. 35 is a sectional view along line X-X' of FIG. 34.

A seventh example of the present invention will be described with reference to FIGS. 34 and 35. FIG. 34 is a partial plan view of a semiconductor storage device according to a seventh example of the present invention, and FIG. 35 is a sectional view along line X-X' of FIG. 34.

The semiconductor storage device of this example has a word line 400, a bit line 401, and a TMR 402 which is a magnetic element. The TMR 402 is disposed corresponding to an intersecting portion of the word line 400 with the bit line 401, and is formed on the word line 400. The bit line 401 is electrically connected to an upper magnetic layer of the TMR 402, and the word line 400 is electrically connected to a lower magnetic layer of the TMR 402. The TMR 402 is basically similar to that of the above-described example.

Next, a method of producing the semiconductor storage device will be described. This example is similar to the third example up to the step of oxidizing a portion which is not covered with a mask 414 in FIGS. 27 and 28. Additionally, the mask 414 is assumed to be constituted of a TiN layer (5 nm thick) and an Al layer (20 nm thick). Next, although not shown, the oxidized region of a portion in which a via-hole for connection to the upper wiring is made in a subsequent step is removed by the photolithography and ion milling techniques.

Next, the Al layer of the mask 414 is removed. An NiFe layer (10 nm thick) is formed on the whole surface, and worked into such a shape that the TMR is held between the layers as shown. On the whole surface, a Ta layer (10 nm thick), a TiN layer (30 nm thick), an AlSiCu layer (500 nm thick), a Ta layer (10 nm thick), an NiFe layer (8 nm thick), and a Ta layer (20 nm thick) are continuously formed by the sputtering process. The wiring material other than the wiring portion is etched to form the bit line 401. Next, a Ta layer (10 nm thick), an NiFe layer (10 nm thick), and a Ta layer (10 nm thick) are formed into films on the whole surface by the sputtering process. Subsequently, the whole surface is etched back to leave the NiFe layer and the Ta layer on the side surfaces of the bit line 401, and further the NiFe layer and the Ta layer protruding from the wiring are removed.

In this example, the magnetic layer for concentrating the current magnetic field is also disposed under the wiring, the tip of the magnetic layer is brought close to the magnetic element, and therefore the magnetic field can be efficiently applied to the magnetic element.

It is to be noted that the present invention is not limited to the above-described examples, and it is evident that the respective examples could be appropriately modified in the scope of the technical idea of the present invention.

INDUSTRIAL APPLICABILITY

As described above, according to the present invention, an upper wiring can be disposed into close contact with a magnetic element. Since a material removing process for separating the magnetic element itself is not required, the magnetic elements can be disposed closer to each other. Accordingly, a semiconductor storage device having high integration and low power consumption can be provided.

The invention claimed is:

1. A semiconductor storage device comprising:
a first conductor wiring;
a second conductor wiring laid above the first conductor wiring in such a manner as to intersect with the first conductor wiring; and
a magnetic element disposed at an intersecting portion formed by the intersection of the first and second conductor wirings,
wherein a region constituted of a high-resistance converted material of a constituting material of a film constituting the magnetic element, or a high-resistance converted material of the constituting material of the film constituting the magnetic element and a constituting material of a conductive film formed on at least one of upper and lower portions of the film is formed adjacent to the magnetic element in at least a part of a film thickness.

2. The semiconductor storage device according to claim 1, wherein a plurality of magnetic elements are disposed, and the region constituted of the high-resistance converted material is at least a part of a region between adjacent magnetic elements.

3. The semiconductor storage device according to claim 2, wherein the region constituted of the high-resistance converted material entirely exists between adjacent magnetic elements.

4. The semiconductor storage device according to claim 1, wherein the magnetic element is positioned between the first and second conductor wirings.

5. The semiconductor storage device according to claim 1, wherein the high-resistance converted material is oxide, nitride, or oxynitride of a constituting material of a film constituting the magnetic element, or oxide, nitride, or oxynitride of the constituting material of the film constituting the magnetic element, and a constituting material of the conductive film.

6. The semiconductor storage device according to claim 1, wherein the high-resistance converted material is formed of all films which are not patterned when defining a region of the magnetic element.

7. The semiconductor storage device according to claim 1, wherein a mask member used for forming the high-resistance converted material is formed as at least a part of an upper electrode for the magnetic element on the magnetic element.

8. The semiconductor storage device according to claim 7, wherein the mask member is formed including a layer constituted of titanium nitride, aluminum, aluminum alloy, platinum, iridium, gold, ruthenium, or indium.

9. The semiconductor storage device according to claim 1, wherein an upper electrode is formed on the magnetic element, and the second conductor wiring is formed in contact with the upper surface and at least two side surfaces facing each other of the upper electrode.

10. The semiconductor storage device according to claim 1, wherein an uppermost layer of the first conductor wiring is formed of a conductive material in which oxidation does not easily proceed as compared with a main component of the wiring.

11. The semiconductor storage device according to claim 10, wherein the uppermost layer of the first conductor wiring is formed of aluminum or titanium nitride.

12. The semiconductor storage device according to claim 1, wherein a tunnel insulation film is formed between the magnetic element and the wiring formed below the element and/or above the element.

13. The semiconductor storage device according to claim 12, wherein the tunnel insulation film comprises a plurality of insulation films having different dielectric constant.

14. The semiconductor storage device according to claim 1, wherein an uppermost layer of the conductive film formed below a film constituting the magnetic element, and/or a lowermost layer of the conductive film formed above the film constituting the magnetic element is formed of a material other than tantalum, which indicates a high resistance value when oxidized.

15. The semiconductor storage device according to claim 14, wherein the material which indicates the high resistance value when oxidized is silicon or zirconium.

16. The semiconductor storage device according to claim 1, wherein a part of the high-resistance converted material is removed without extending a total film thickness, and a removed space is filled with a deposited insulating material.

17. The semiconductor storage device according to claim 1, wherein at least one of the first and second conductor wirings has a first wiring layer formed by removing a part of a conductive film formed on a flat region, and a second wiring layer formed by filling in a trench of an insulation film in which the trench is formed above the first wiring layer.

18. The semiconductor storage device according to claim 1, wherein the magnetic element contains a metal material including FeMn, NiMn, IrMn, or PtMn as a main component.

19. The semiconductor storage device according to claim 1, wherein a magnetic layer is attached to at least one of the first and second conductor wirings in at least a part of a portion other than a portion facing the magnetic element.

20. The semiconductor storage device according to claim 19, wherein the magnetic layer attached to the side surface of the second conductor wiring is positioned in contact with a region constituted of the high-resistance converted material or at a distance of 20 nm or less from the region.

21. The semiconductor storage device according to claim 19, wherein the magnetic layer attached to the side surface of the second conductor wiring is formed by a film deposition and anisotropic etching.

22. The semiconductor storage device according to claim 1, wherein at least some of magnetic films constituting the magnetic element are formed in contact with the conductive film, and a region constituted of the high-resistance converted material is formed of oxide, nitride, or oxynitride of a synthetic material of a constituting material of the conductive film and a constituting material of at least some of films constituting the magnetic element.

23. The semiconductor storage device according to claim 22, wherein the conductive film is formed of a material containing at least one of tantalum, aluminum, silicon, zirconium, cerium, and hafnium.

24. The semiconductor storage device according to claim 1, wherein a region formed of oxide, nitride, or oxynitride is formed above a boundary portion between the magnetic element and the region constituted of the high-resistance converted material, and the region constituted of the high-resistance converted material is formed of oxide, nitride, or oxynitride of a synthetic material of a constituting material of a region formed of oxide, nitride, or oxynitride and a constituting material of at least some of films constituting the magnetic element.

25. The semiconductor storage device according to claim 24, wherein the region formed of oxide, nitride, or oxynitride is formed of a material including at least one of tantalum, aluminum, silicon, zirconium, cerium, and hafnium.

26. The semiconductor storage device according to claim 1, wherein the region constituted of the high-resistance converted material comprises films corresponding to all films constituting the magnetic element.

27. The semiconductor storage device according to claim 1, wherein the region constituted of the high-resistance converted material comprises films corresponding to some of films constituting the magnetic element, a film having conductivity equal to that of other films constituting the magnetic element is disposed under the region constituted of the high-resistance converted material, and the magnetic element is electrically connected to the other magnetic element by the film having the conductivity in a direction of the first conductor wiring.

28. The semiconductor storage device according to claim 1, wherein the region constituted of the high-resistance converted material is formed of oxide, nitride, or oxynitride containing as main component a constituting material of at least some of films constituting the magnetic element, a magnetic film is formed on the surface of the second conductor wiring opposite to the surface thereof facing the magnetic element, and a flat-surface shape of the magnetic film is analogous to that of the magnetic element.

29. The semiconductor storage device according to claim 28, wherein a pair of magnetic films are formed in such a manner as to hold the magnetic element between the second conductor wiring and the magnetic element.

30. A semiconductor storage device in which a plurality of layers of the structure according to any one of claims 1 to 29 are stacked.

31. A method of producing a semiconductor storage device, comprising: a step of depositing a magnetic element forming film on a flat surface to which the surface of a lower-layer conductive film is exposed;
   a step of forming a mask on the magnetic element forming film;
   a step of converting the magnetic element forming film of a region which is not protected by the mask into a high-resistance converted material to form an isolated magnetic element under the mask; and
   a step of removing at least a part of the mask, after the step of converting the magnetic element forming film of the region which is not protected by the mask into the high-resistance converted material.

32. The method of producing the semiconductor storage device according to claim 31, wherein the step of converting the magnetic element forming film of the region which is not protected by the mask into the high-resistance converted material is performed by oxidation, nitriding, or oxynitriding.

33. The method of producing the semiconductor storage device according to claim 32, wherein the oxidation, nitriding, or oxynitriding includes: a process of ion-implanting a material containing an oxygen atom and/or a nitrogen atom into the magnetic element forming film of the region which is not protected by the mask; and/or a process of bringing ion, radical, or ozone of the atom into contact with the magnetic element forming film of the region which is not protected by the mask at high temperature.

34. The method of producing the semiconductor storage device according to claim 31, wherein a conductive film is formed on at least one of upper and lower portions of the magnetic element forming film in the step of depositing the magnetic element forming film, and the magnetic element forming film including at least a part of the conductive film is oxidized, nitrided or oxynitrided in the step of forming the magnetic element, to thereby convert the magnetic element forming film into the high-resistance converted material.

35. The method of producing the semiconductor storage device according to claim 31, further comprising: a step of storing the material in an oxygen and/or nitrogen atmosphere at high temperature after the step of converting the magnetic element forming film of the region which is not protected by the mask into the high-resistance converted material.

36. A method of producing a semiconductor storage device, comprising the steps of:
   a step of depositing a magnetic element forming film on a flat surface to which the surface of a lower-layer conductive film is exposed;
   a step of forming a mask on the magnetic element forming film;
   a step of converting the magnetic element forming film of a region which is not protected by the mask into a high-resistance converted material to form an isolated magnetic element under the mask; and
   a step of introducing an atom which is easy to insulate into the magnetic element forming film of the region which is not protected by the mask, before the step of converting the magnetic element forming film of the region which is not protected by the mask into the high-resistance converted material.

37. The method of producing the semiconductor storage device according to claim 36, wherein the atom which is easy to insulate is one or a plurality of silicon, zirconium, cerium, and hafnium.

38. The method of producing the semiconductor storage device according to claim 36, wherein a method of introducing the atom which is easy to insulate or which is not converted into the ferromagnetic material is an ion implantation method, or a method of forming a film containing the atom on the magnetic element forming film to diffuse the atom at high temperature, or apply another atom or molecule to the surface of the film to implant a film component.

39. A method of producing a semiconductor storage device, comprising:
   a step of depositing a magnetic element forming film on a flat surface to which the surface of a lower-layer conductive film is exposed;
   a step of forming a mask on the magnetic element forming film;
   a step of converting the magnetic element forming film of a region which is not protected by the mask into a high-resistance converted material to form an isolated magnetic element under the mask; and
   a step of introducing an atom which is not converted into a ferromagnetic material by the step of converting the film into the high-resistance converted material into the magnetic element forming film of the region which is not protected by the mask, before the step of converting the magnetic element forming film of the region which is not protected by the mask into the high-resistance converted material.

40. A method of producing a semiconductor storage device, comprising:
   a step of depositing a magnetic element forming film on a flat surface to which the surface of a lower-layer conductive film is exposed;
   a step of forming a mask on the magnetic element forming film;
   a step of converting the magnetic element forming film of a region which is not protected by the mask into a high-resistance converted material to form an isolated magnetic element under the mask; and
   a step of removing a part or all of the formed high-resistance converted material and filling the removed space with a deposited insulating material, after the step of converting the magnetic element forming film of the region which is not protected by the mask into the high-resistance converted material.

41. A method of producing a semiconductor storage device, comprising:
   a step of depositing a magnetic element forming film on a flat surface to which the surface of a lower-layer conductive film is exposed;
   a step of forming a mask on the magnetic element forming film;
   a step of converting the magnetic element forming film of a region which is not protected by the mask into a high-resistance converted material to form an isolated magnetic element under the mask; and
   a step of forming an upper-layer wiring electrically connected to the magnetic element, removing a part of the high-resistance converted material using the upper-layer wiring as the mask to form an insulated trench and forming a filling insulation film to fill in the insulated trench and between the upper-layer wirings, after the step of converting the magnetic element forming film of the region which is not protected by the mask into the high-resistance converted material.

* * * * *